(12) United States Patent
Eriguchi

(10) Patent No.: US 6,734,069 B2
(45) Date of Patent: May 11, 2004

(54) METHOD OF FORMING A HIGH DIELECTRIC CONSTANT INSULATING FILM AND METHOD OF PRODUCING SEMICONDUCTOR DEVICE USING THE SAME

(75) Inventor: Koji Eriguchi, Shiga (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/221,265

(22) PCT Filed: Feb. 1, 2002

(86) PCT No.: PCT/JP02/00866
§ 371 (c)(1),
(2), (4) Date: Sep. 11, 2002

(87) PCT Pub. No.: WO02/063668
PCT Pub. Date: Aug. 15, 2002

(65) Prior Publication Data
US 2003/0092238 A1 May 15, 2003

(30) Foreign Application Priority Data
Feb. 6, 2001 (JP) .......................... 2001-029658
Sep. 4, 2001 (JP) .......................... 2001-266693

(51) Int. Cl.[7] .......................................... H01L 21/4757
(52) U.S. Cl. ...................... 438/287; 438/591; 438/785
(58) Field of Search ................................ 438/216, 240, 438/287, 513, 514, 591, 785, 786

(56) References Cited

U.S. PATENT DOCUMENTS

| | | | |
|---|---|---|---|
| 6,013,553 A | | 1/2000 | Wallace et al. |
| 6,020,243 A | * | 2/2000 | Wallace et al. ............. 438/287 |
| 6,184,072 B1 | * | 2/2001 | Kaushik et al. ............. 438/197 |
| 2001/0024860 A1 | * | 9/2001 | Park et al. .................. 438/287 |
| 2002/0135030 A1 | * | 9/2002 | Horikawa .................... 257/405 |
| 2002/0163050 A1 | * | 11/2002 | Bourdelle et al. .......... 257/410 |

FOREIGN PATENT DOCUMENTS

| | | | | |
|---|---|---|---|---|
| JP | 58-93331 A | 6/1983 | | |
| JP | 61-137370 A | 6/1986 | | |
| JP | 61137370 A | * 6/1986 | .......... H01L/29/78 |
| JP | 01071166 A | * 3/1989 | .......... H01L/27/04 |
| JP | 64-71166 A | 3/1989 | | |
| JP | 1-196154 A | 8/1989 | | |
| JP | 1-257366 A | 10/1989 | | |
| JP | 2000-307083 A | 11/2000 | | |
| JP | 2000-349287 A | 12/2000 | | |

* cited by examiner

Primary Examiner—Carl Whitehead, Jr.
Assistant Examiner—Stephen W. Smoot
(74) Attorney, Agent, or Firm—McDermott, Will & Emery

(57) ABSTRACT

A high dielectric film is formed by utilizing atom injection into a film through ion implantation or the like, and heat treatment. For example, an $SiO_2$ film 102 which is a thermal oxide film is formed on a silicon substrate 101, and then Zr ions ($Zr^+$) are injected from a plasma 105 into the $SiO_2$ film 102. Thereafter, by annealing the $SiO_2$ film 102 and a Zr injected layer 103, injected Zr is diffused in the Zr injected layer 103 and then the $SiO_2$ film 102 and the Zr injected layer 103 are as a whole changed into a high dielectric film 106 of a high dielectric constant formed of Zr—Si—O (silicate). By using the high dielectric film 106 as an insulating film for an MISFET, an MISFET having excellent gate leakage properties can be achieved.

28 Claims, 15 Drawing Sheets

PRIOR ART

METHOD OF FORMING A HIGH DIELECTRIC CONSTANT INSULATING FILM AND METHOD OF PRODUCING SEMICONDUCTOR DEVICE USING THE SAME

TECHNICAL FIELD

The present invention relates to methods and apparatuses for fabricating semiconductor devices and more particularly relates to a method for forming a very thin gate insulating film having a high dielectric constant.

BACKGROUND ART

Recently, with a great progress in a high degree of integration of semiconductor integrated circuits, attempts have been made at reducing the size of transistor devices and increasing the performance thereof in MOS semiconductor devices. Specifically, as the size of devices such as transistors has been reduced, achievement of highly reliable MOS devices is required. In order to increase the reliability of MOS devices, each member composing a MOS device should be highly reliable. Specifically, as for gate insulating films used in MOS devices, the thickness thereof has been rapidly reduced and it is expected that very thin gate insulating films having a thickness of 2 nm or less will be commonly used during the $21^{st}$ century. As the thickness of a gate insulating film becomes thinner, a higher degree of uniformity in properties of the gate insulating film is required. Therefore, the achievement of gate insulating films having excellent properties has been regarded as important so that properties of a gate insulating film are said to determine characteristics of a MOS transistor and even electric properties of a semiconductor integrated circuit.

Currently, $SiO_2$ films are used as gate insulating films in most cases. When an $SiO_2$ film is used as a gate insulating film, there have been big problems, in very thin regions having a thickness of 2 nm or less, of reduced reliability of the insulating film and increased gate leakage current which is directly caused by a tunnel phenomenon current. In fact, the gate leakage current has to be suppressed to achieve an LSI having low power consumption. However, such gate leakage current due to the tunnel phenomenon is a phenomenon that is governed by physical rules and is strongly influenced by the physical characteristics of $SiO_2$ films. Therefore, it is no longer possible to achieve the LSIs having low power consumption by the very thin $SiO_2$ films.

Then, there have been increased efforts to adopt a film having a higher dielectric constant than the $SiO_2$ film, thereby ensuring as great a capacitance as that of the very thin $SiO_2$ film while increasing the thickness of the insulating film to suppress leakage current, for example, as described in a reference material (Lee et al. IEEE/International Electron Device Meeting 99, p. 133). For example, by using an $HfO_2$ film (a high dielectric film) as a gate insulating film, it is possible to achieve a transistor which has a capacitance corresponding to a thickness of 2 nm or less in terms of the $SiO_2$ film and which occurs three orders of smaller leakage current than the $SiO_2$ film. For example, if the gate insulating film is composed of $HfO_2$, a method for depositing films using reactive sputtering is generally adopted.

FIGS. 18(a) through 18(c) are cross-sectional views illustrating process steps of forming a gate insulating film composed of an $HfO_2$ film by a plasma CVD method.

A p-type Si substrate 501 shown in FIG. 18(a) is first prepared, and then in the process step shown in FIG. 18(b), an $HfO_2$ target is bombarded with Ar ions to sputter the Hf atoms, thereby injecting the Hf atoms into an Ar plasma 504. An $HfO_2$ activated species 503 is generated in the Ar plasma 504, and the $HfO_2$ activated species 503 is deposited on the Si substrate 501 to form an $HfO_2$ film 502. Then, in the process step shown in FIG. 18(c), a polysilicon film 505 is deposited on the $HfO_2$ film 502. Thereafter, the polysilicon film 505 and the $HfO_2$ film are patterned, and thereby a gate insulating film and a gate electrode can be formed, though they are not shown.

As for system LSIs, LSIs in which multiple types of MIS devices including gate insulating films with different thicknesses are mounted are utilized. Conventionally, an LSI in which two types of devices, i.e., an MIS device of a 3.3 V system including a thick gate insulating film and provided in an I/O section and an MIS device including a thin gate insulating film provided in a logic core section, are mounted has been well known. Nowadays, however, the thin gate oxide film being provided in the logic core section is subdivided into more types, and in order to reduce the gate leakage current in a stand-by state, an MIS device in which the thickness of an gate insulating film has been physically increased is provided only in a specific part of an LSI. In this case, a film forming method in which ions, such as F ions, have been implanted in advance into a substrate region on which a thick gate insulating film is to be formed, and gate insulating films having different thicknesses are simultaneously formed on the same substrate by using the difference in oxidation speed between the ion-implanted region and the remaining region, or like methods are adopted.

Problems to be Solved

It has been pointed that when the $HfO_2$ film or a $ZrO_2$ film which has a high dielectric constant is used as the gate insulating film of a MOS transistor, the interface between the gate insulating film and an Si substrate has poor properties relative to the case of using an $SiO_2$ film and therefore that characteristics of the MOS transistor can not be expectedly improved. In the case of a sputtering method concerns arise about damages to the Si substrate 501 due to ion attacks. Thus, there have been more cases in which not the $HfO_2$ film or the $ZrO_2$ film but so-called silicate materials such as HfSiO-based materials or ZrSiO-based materials are introduced. However, the silicate materials have problems, such as difficulties in controlling the composition of a film containing a silicate material or great difficulties in controlling the thickness of an $SiO_2$ layer around the surface of the Si substrate in forming a silicate layer. Accordingly, when a silicate material is used as the gate insulating film, the level of the gate leakage current varies widely, and therefore the silicate material is not suitable for mass production.

Furthermore, when multiple types of gate insulating films composed of an oxide film (or an oxynitride film) and having different thicknesses are provided on a substrate in accordance with desired characteristics of the transistor, it is difficult to control the thicknesses of the insulating films with high accuracy in the known method in which the oxidation speed is varied by implanting F ions, and therefore the capacitance between the gate and the substrate unwantedly varies widely. On the other hand, when a step of partially removing the oxide film is repeatedly performed to form three oxide films or oxynitride films having different thicknesses, problems caused by etching a silicon substrate surface for many times might become noticeable.

DISCLOSURE OF INVENTION

An object of the present invention is to provide a method for easily forming a gate insulating film in which good properties of an $SiO_2$ film on an Si substrate is maintained and which has a high dielectric constant, and a method for fabricating a semiconductor device including the gate insulating film so as to accommodate size reduction of transistors.

A first method for forming an insulating film according to the present invention includes the steps of: a) introducing at least oxygen into a surface region of a semiconductor substrate, thereby forming an initial insulating film; b) introducing at least one type of metal into at least part of the initial insulating film; and c) performing heat treatment to diffuse the metal in the initial insulating film, thereby forming at least one high dielectric film having a higher dielectric constant than the initial insulating film on at least part of the semiconductor substrate.

According to the method, a metal that has been introduced into at least part of an initial insulating film is diffused, thereby forming from the initial insulating film a high dielectric film having a high dielectric constant. Thus, for example, it is possible to increase the thickness of the initial insulating film without changing the capacitance of the entire initial insulating film and in such a case the leakage current can be reduced. Moreover, in the case where the capacitance of the high dielectric film is increased to become larger than that of the entire initial insulating film, a good state at the interface between the initial insulating film formed by introducing oxygen into a semiconductor substrate and the semiconductor substrate can be maintained. Accordingly, an insulating film which has a good interface state between the insulating film and the semiconductor substrate and excellent leakage properties can be achieved by relatively simple process steps.

In the step a), a silicon substrate can be used as the semiconductor substrate, and a silicon oxide film or a silicon oxynitride film can be formed as the initial insulating film.

In the step b), the metal injected is at least one metal selected from the group consisting of Hf, Zr and Al. Thereby, an insulating film having a particularly high dielectric constant can be achieved.

In the step c), an $SiO_2$ film may be left in a region around the interface between the initial insulating film and the semiconductor substrate.

In the step b), metal ions in a plasma may be introduced into the initial insulating film. Thereby, metal is effectively introduced into the initial insulating film.

In the step b), the metal ions may be introduced into the initial insulating film by an ion implantation method.

In the step b), the metal may be introduced into only a first transistor formation region in the initial insulating film and in the step c), the high dielectric film may be formed in only the first transistor formation region in the initial insulating film, whereby the high dielectric film is used as a gate insulating film of a first transistor and the initial insulating film is used as a gate insulating film of a second transistor which operates at a slower speed than the first transistor. For example, in a semiconductor integrated circuit, the first transistor may be used as a transistor which is required to operate at a high speed and the second transistor may be used as a transistor which is required to have high reliability.

In the step b), different types of multiple metals, as said at least one type of metal, may be introduced into multiple regions in the initial insulating film, and in the step c), the metals may be diffused in the initial insulating film to form as said at least one high dielectric film multiple high dielectric films having a higher dielectric constant than the initial insulating film, and the high dielectric films may be used as gate insulating films of multiple transistors having different operation characteristics. In this manner, multiple types of transistors having different properties (e.g., threshold voltage) can be provided on the semiconductor substrate without changing the thicknesses of the gate insulating films unlike the known method. An example of such cases is the case where a transistor in an I/O section, a transistor which is required to operate at a high speed and a transistor which can operate at a relatively slow speed and has a low threshold voltage are mounted.

In the step b), one type of metal may be introduced into multiple regions in the initial insulating film at different concentrations and in the step c), the metal may be diffused in the initial insulating film to form as said at least one high dielectric film multiple high dielectric films having a higher dielectric constant than the initial insulating film. In this manner, also, multiple types of transistors having different properties (e.g., threshold voltage) can be provided on the semiconductor substrate.

A second method for forming an insulating film according to the present invention includes the steps of a) forming an initial insulating film including at least a metal oxide film on a semiconductor substrate; b) injecting atoms of the semiconductor forming the semiconductor substrate into at least part of the initial insulating film; and c) performing heat treatment to diffuse the atoms of the semiconductor in the initial insulating film, thereby forming at least one dielectric film having a different dielectric constant from the initial insulating film in at least part of the initial insulating film.

According to the method, a dielectric film is formed from a metal oxide film having a high dielectric constant so that a dielectric film having a higher dielectric constant than a known thermal oxide film is obtained. Therefore, a dielectric film having excellent leakage properties can be obtained in a relatively simple manner.

In the step c), the heat treatment may be performed in an oxidizing atmosphere. In this manner, the surface portion of the semiconductor substrate is thermally oxidized so that the rate of contained semiconductor atoms, i.e., O atoms increases in part of the dielectric film which is closer to the semiconductor substrate, resulting in a good interface state between the dielectric film and the semiconductor substrate.

It is preferable that in the step a), a silicon substrate is used as the semiconductor substrate and that a layered film selected from the group consisting of layered films of an $SiO_2$ film and a $ZrO_2$ film, an $SiO_2$ film and an $HfO_2$ film, and a $ZrO_2$ film and an $HfO_2$ film is formed as the initial insulating film.

In the step b), the atoms of the semiconductor may be introduced into multiple regions in the initial insulating film at different concentrations and in the step c), multiple dielectric films having different dielectric constants may be formed as said at least one dielectric film, wherein the dielectric films may be used as gate insulating films of multiple transistors having different operation characteristics. In this manner, multiple types of transistors having different properties (e.g., threshold voltage) can be provided on the semiconductor substrate without changing the thicknesses of the gate insulating films unlike the known method. An example of such cases is the case where a transistor in an I/O section, a transistor which is required to operate at a high speed and a transistor which can operate at a relatively slow speed and has a low threshold voltage are mounted.

A third method for forming an insulating film according to the present invention includes the steps of: a) introducing at least oxygen into a surface region of a semiconductor substrate, thereby forming an initial insulating film; b) introducing at least one type of metal into at least part of the initial insulating film; c) forming a conductor film on the initial insulating film; d) patterning the conducting film, thereby forming a gate electrode of at least one transistor; and e) introducing an impurity into regions of the semiconductor substrate located on both sides of the gate electrode, thereby forming source/drain regions of at least one transistor; and f) performing heat treatment to activate the impurity which has been introduced into the source/drain regions and to diffuse the metal in the initial insulating film, thereby forming in at least part of the initial insulating film a high dielectric film which has a higher dielectric constant than the initial insulating film and which serves as a gate insulating film of at least one transistor.

According to the method, a metal that has been introduced into at least part of an initial insulating film is diffused, thereby forming a high dielectric film having a high dielectric constant from the initial insulating film, in the same manner as according to the method for forming an initial insulating film. Thus, for example, it is possible to increase the thickness of the initial insulating film without changing the capacitance of the entire initial insulating film, resulting in the reduction of leakage current. Moreover, in the case where the capacitance of the high dielectric film is increased to become larger than that of the entire initial insulating film, a good state at the interface between the initial insulating film formed by introducing oxygen into a semiconductor substrate and the semiconductor substrate can be maintained. Accordingly, an insulating film which has a good interface state between the insulating film and the semiconductor substrate and excellent leakage properties can be achieved by a relatively simple process steps.

In the step a), a silicon substrate may be used as the semiconductor substrate and a silicon oxide film or a silicon oxynitride film may be formed as the initial insulating film.

In the step b), different types of multiple metal films may be deposited on multiple regions in the initial insulating films and in the step c), multiple high dielectric films having different dielectric constants may be formed as said at least one high dielectric film, wherein the high dielectric films may be used as gate insulating films of multiple transistors having different operation characteristics. In this manner, multiple types of transistors having different properties (e.g., threshold voltage) can be provided on the semiconductor substrate without changing the thicknesses of the gate insulating films unlike the known method. An example of such cases is the case where a transistor in an I/O section, a transistor which is required to operate at a high speed and a transistor which can operate at a relatively slow speed and has a low threshold voltage are mounted.

A first method for fabricating a semiconductor device according to the present invention includes the steps of: a) introducing at least oxygen into a surface region of a semiconductor substrate, thereby forming an initial insulating film; b) introducing at least one type of metal into at least part of the initial insulating film; c) forming a conductor film on the initial insulating film; d) patterning the conductor film, thereby forming a gate electrode of at least one transistor; and e) introducing an impurity into regions of the semiconductor substrate located on both sides of the gate electrode, thereby forming source/drain regions of at least one transistor; and f) performing heat treatment to activate the impurity which has been introduced into the source/drain regions, and to diffuse the metal in the initial insulating film, thereby forming in at least part of the initial insulating film a high dielectric film which has a higher dielectric constant than the initial insulating film and which serves as a gate insulating film of at least one transistor.

According to the method, a semiconductor device including an insulating film, which is formed according to the initial insulating film formation method and has a good interface state between the insulating film and the semiconductor substrate and excellent leakage properties, can be achieved.

In the step b), the metal may be introduced into only a first transistor formation region in the initial insulating film and in the step f), the high dielectric film may be formed in only the first transistor formation region in the initial insulating film, wherein, as said at least one transistor, a first transistor in which the high dielectric film serves as a gate insulating film, and a second transistor in which the initial insulating film serves as a gate insulating film and which operates at a slower speed than the first transistor may be formed. Thereby, for example, in a semiconductor integrated circuit, the first transistor can be used as a transistor which is particularly required to operate at a high speed and the second transistor can be used as a transistor which is required to have high reliability.

In the step b), different types of multiple metals, as said at least one type of metal, may be introduced into multiple regions in the initial insulating film, and in the step f), the metals may be diffused in the initial insulating film to form as said at least one high dielectric film multiple high dielectric films having a higher dielectric constant than the initial insulating film, wherein multiple transistors including the high dielectric films which serve as gate insulating films and having different operation characteristics may be formed.

A second method for fabricating a semiconductor device according to the present invention includes: a) forming an initial insulating film including at least a metal oxide film on a semiconductor substrate; b) injecting atoms of the semiconductor forming the semiconductor substrate into at least part of the initial insulating film; c) forming a conductor film on the initial insulating film; d) patterning the conductor film, thereby forming a gate electrode of at least one transistor; e) introducing an impurity into regions of the semiconductor substrate located on both sides of the gate electrode, thereby forming source/drain regions of at least one transistor; and f) performing heat treatment to activate the impurity which has been introduced into the source/drain regions, and to diffuse the atoms of the semiconductor in the initial insulating film, thereby forming in at least part of the initial insulating film a dielectric film which has a different dielectric constant from the initial insulating film and which serves as a gate insulating film of at least one transistor.

According to the method, a semiconductor device including an insulating film, which has a good interface state between the insulating film and the semiconductor substrate and excellent leakage properties, can be achieved.

In the step b), the atoms of the semiconductor may be introduced into multiple regions in the initial insulating film at different concentrations, and in the step c), multiple dielectric films having different dielectric constants may be formed as said at least one dielectric film, wherein multiple transistors including the high dielectric films which serve as gate insulating films and having different operation characteristics may be formed as said at least one transistor.

A third method for fabricating a semiconductor device according to the present invention includes the steps of: a) forming an initial insulating film on a semiconductor substrate; b) depositing a metal film on at least part of the initial insulating film; c) forming a conductor film on the metal film; d) patterning the conductor film, thereby forming a gate electrode; e) introducing an impurity into regions of the semiconductor substrate located on both sides of the gate electrode, thereby forming source/drain regions; and f) performing heat treatment to activate the impurity which has been introduced into the source/drain regions, and to diffuse metal atoms of the metal film in the initial insulating film, thereby forming in at least part of the initial insulating film a high dielectric film which has a higher dielectric constant than the initial insulating film and which serves as a gate insulating film of at least one transistor.

According to the method, also, a semiconductor device including an insulating film, which has a good interface state between the insulating film and the semiconductor substrate and excellent leakage properties, can be achieved.

In the step b), different types of multiple metal films may be deposited on multiple regions in the initial insulating films, and in the step f), multiple dielectric films having different dielectric constants may be formed as said at least one dielectric film, wherein multiple transistors including the high dielectric films as gate insulating films and having different operation characteristics may be formed.

BEST MODE FOR CARRYING OUT THE INVENTION

First Embodiment

Figure 1A:
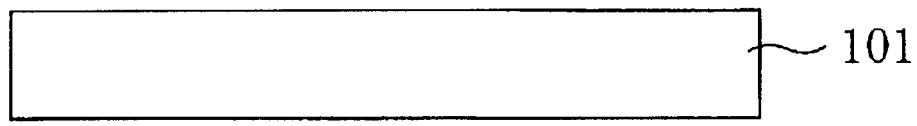
FIGS. 1(a) through 1(d) are cross-sectional views illustrating the first half of process steps of forming an MISFETs including a high dielectric gate insulating film according to a first embodiment.

Hereinafter, an apparatus and a method for fabricating a semiconductor device according to a first embodiment of the present invention will be described with reference to FIGS. 1(a) through 1(d), FIGS. 2(a) through 2(c), FIG. 3, FIG. 4 and FIG. 5.

FIGS. 1(a) through 1(d) and FIGS. 2(a) through 2(c) are cross-sectional views illustrating process steps of forming an MISFET (semiconductor device) including a high dielectric gate insulating film according to the present embodiment. FIG. 3 is a plane view schematically illustrating the structure of a fabrication apparatus used for fabricating a semiconductor device in accordance with the present embodiment.

As shown in FIG. 3, the fabrication apparatus used in the present embodiment is a so-called "clustering apparatus" including a high-speed oxidation furnace 251 for forming a thermal oxide film, a Zr plasma generation chamber 252, a high-speed heat treatment furnace 254 for heat treatment, a cooling chamber 255, a load-lock chamber 253, and a wafer load/unload section 256. Specifically, a series of process steps from forming a thermal oxide film at a reduced pressure to forming a gate insulating film having a high dielectric constant are carried out at a reduced pressure using the clustering apparatus in the present embodiment.

First, in the process step shown in FIG. 1(a), a p-type silicon substrate 101 in a wafer state is prepared. Then, preliminary washing is performed for the silicon substrate 101 and then the silicon substrate 101 is loaded into the load-lock chamber 253 of the clustering apparatus.

Figure 1B:
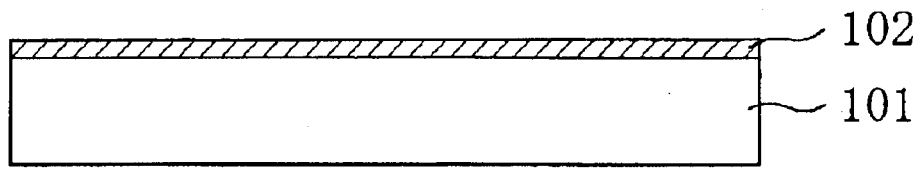

Next, in the process step shown in FIG. 1(b), the silicon substrate 101 is introduced into the high-speed oxidation furnace 201 and then an $SiO_2$ film 102 having an optical film thickness of 5.0 nm is formed on the silicon substrate by thermal oxidation. In this case, $O_2$ gas is introduced into the furnace and thermal oxidation is performed at 900° C. for 30 sec.

Subsequently, in the process step shown in FIG. 1(c), the silicon substrate 101 is loaded into the plasma generation chamber 252 and Zr ions (Zr⁺) are introduced into the SiO₂ film 102 from a Zr plasma 105 formed by Ar sputtering.

Figure 4:
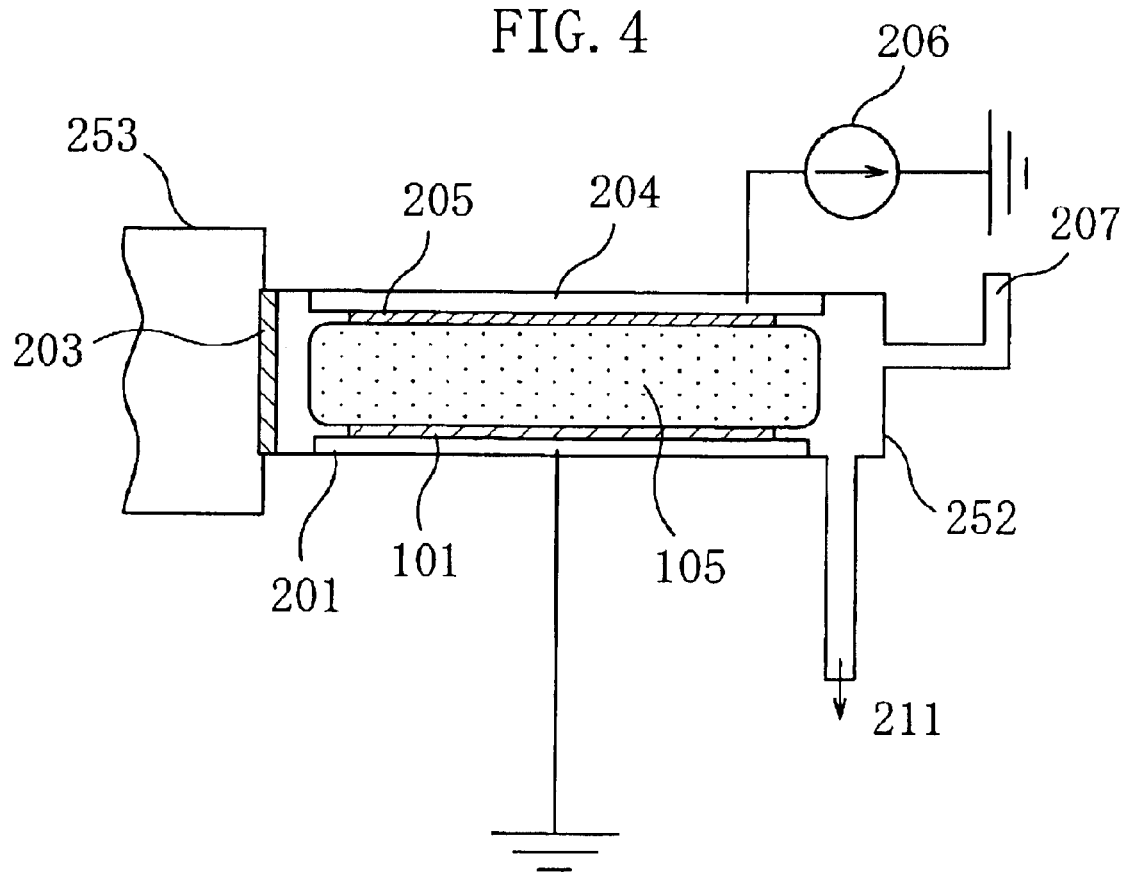
FIG. 4 is a cross-sectional view schematically illustrating the structure of the Zr plasma generation chamber used in the first embodiment.

FIG. 4 is a cross-sectional view schematically illustrating the structure of the Zr plasma generation chamber 252. As shown in FIG. 4, a wafer stage 201 for holding a silicon substrate, a Zr target 205 to which a DC bias is applied by a DC bias source 206, and a target holder 204 are disposed in the Zr plasma generation chamber 252. A gate valve 203 is provided between the Zr plasma generation chamber 252 and the load-lock chamber 253, and a gas introduction section 207 for introducing gas into the Zr plasma generation chamber 252 and a gas exhausting section 211 for exhausting gas from the Zr plasma generation chamber 252 are also provided.

In the Zr plasma generation chamber 252, under the conditions where the flow rate of Ar gas is 80 sccm and the pressure of the inside of the chamber 252 is 100 mTorr (≈13.3 Pa), a bias of 1 kV is applied from the DC bias source 206 to the Zr target 205 to perform a plasma processing for about 60 sec. At this time, as shown in FIG. 1(c), Zr atoms and ions are sputtered from the Zr target 205 into the plasma 105 so that Zr ions (Zr⁺) are injected from the plasma 105 into the SiO₂ film 102. As a result, Zr ions are injected into the SiO₂ film 102 to reach a depth of nearly 4 nm from the surface thereof and the upper part of the SiO₂ film 102 changes into a Zr injected layer 103 that is an oxide silicon layer having a composition containing a large number of Zr atoms.

Note that a bias to be applied to the plasma is preferably adjusted so that the self-bias of the plasma ions becomes about 100 to 1500 eV.

Next, in the process step shown in FIG. 1(d), the SiO₂ film 102 and the Zr injected layer 103 are subsequently annealed in the high-speed heat treatment furnace 254 at 650° C. for 10 sec. By the annealing, Zr that has been injected into the Zr injected layer 103 is diffused and thereby the SiO₂ film 102 and the Zr injected layer 103 are as a whole changed into a high dielectric film 106 having a high dielectric constant, composed of Zr—Si—O (silicate).

In this case, it is known that particularly good properties can be achieved by performing an annealing process at a temperature that does not exceed a recrystallization temperature (700° C. for the dielectric film 106 composed of Zr—Si—O).

Figure 1C:
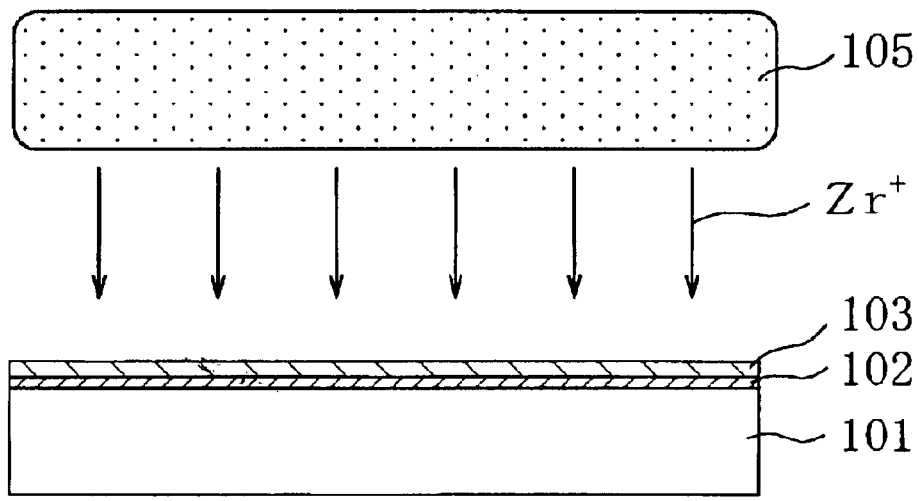
Figure 1D:
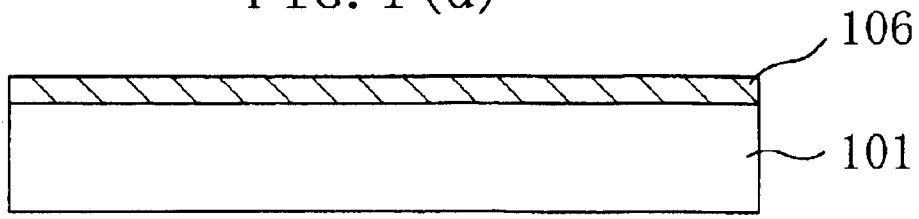

Note that without Zr being diffused throughout the thickness of the silicon oxide film 102 remaining in the lower part of the Zr injected layer 103, the silicon oxide film may be left in the lower part of the silicate layer composed of Zr—Si—O in the process step shown in FIG. 1(d). Even in such a case, in the present embodiment, the silicate layer and the silicon oxide film are as a whole defined as the high dielectric film 106.

Figure 5:
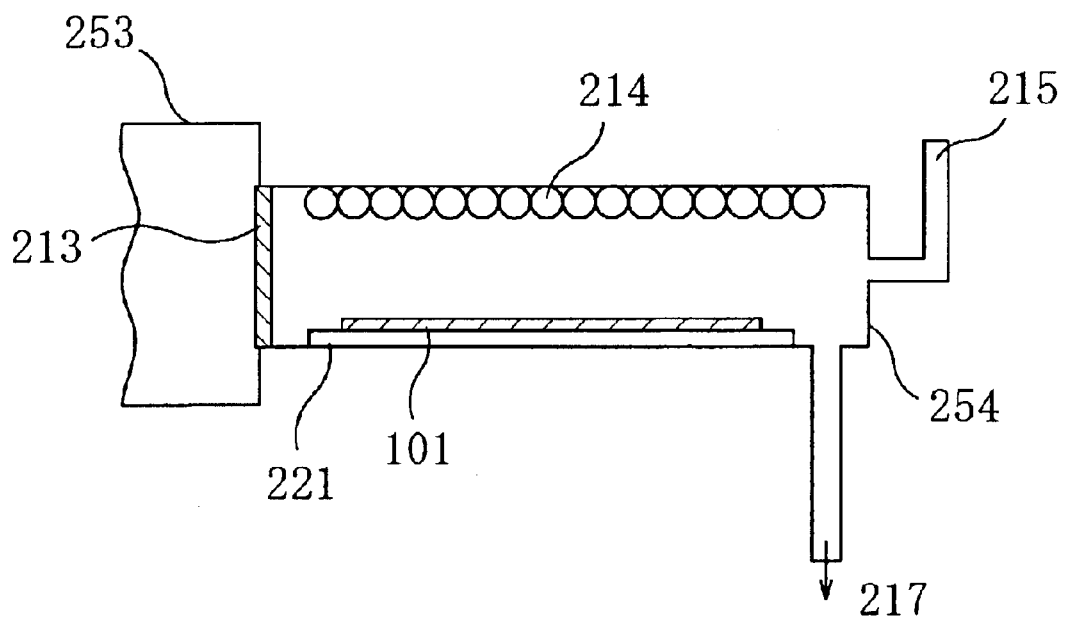
FIG. 5 is a cross-sectional view schematically illustrating the structure of the high-speed heat treatment furnace used in the first embodiment.

FIG. 5 is a cross-sectional view schematically illustrating the structure of the high-speed heat treatment furnace 254. As shown in FIG. 5, a wafer stage 221 for holding a silicon substrate and an infrared radiation heating mechanism 214 are disposed in the high-speed heat treatment furnace 254. Moreover, a gate valve 213 is provided between the high-speed heat treatment furnace 254 and the load-lock chamber 253, and a gas introduction section 215 for introducing gas (N2 gas) into the high-speed heat treatment furnace 254 and a gas exhaust section 217 for exhausting gas from the high-speed heat treatment furnace 254 are provided.

Figure 2A:
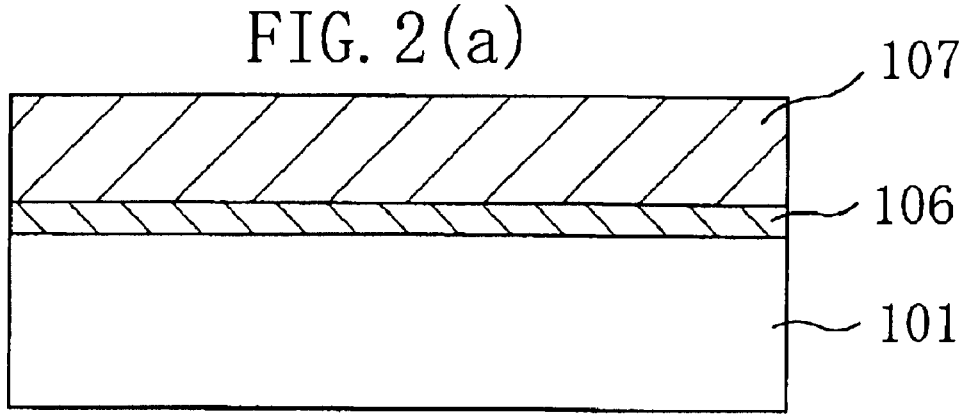
FIGS. 2(a) through 2(c) are cross-sectional views illustrating the latter half of the process steps of forming the MISFET including a high dielectric gate insulating film according to the first embodiment.
Figure 3:
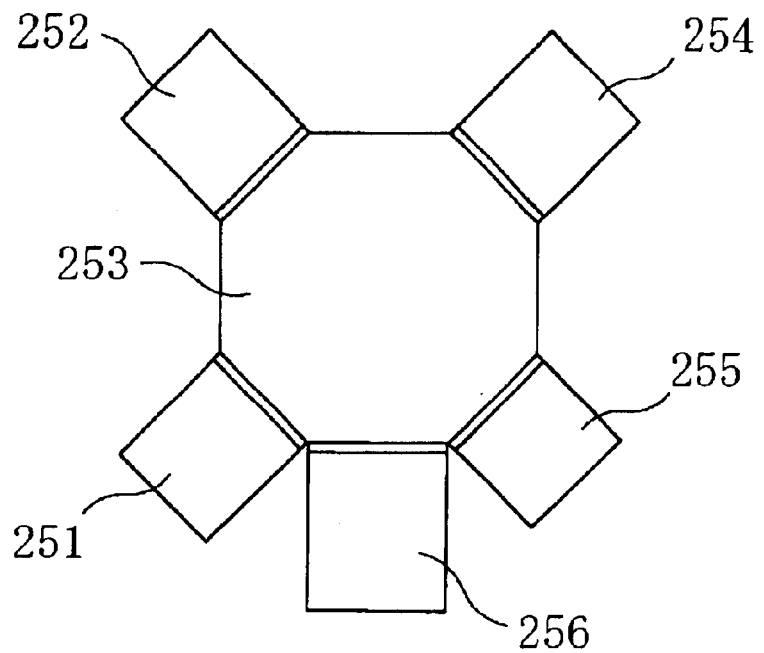
FIG. 3 is a plane view schematically illustrating the structure of a fabrication apparatus used for fabricating semiconductor devices in accordance with the first embodiment.

Next, in the process step shown in FIG. 2(a), the silicon substrate is removed from the clustering apparatus and transferred into a general purpose CVD chamber (not shown). Then, a polysilicon film 107 is deposited on the high dielectric film 106 by CVD. Thereafter, according to the channel type of a MISFET that is to be formed, the polysilicon film 107 is doped with a p-type impurity such as boron (for pMISFET formation region) or an n-type impurity such as arsenic (for nMISFET formation region).

Figure 2B:
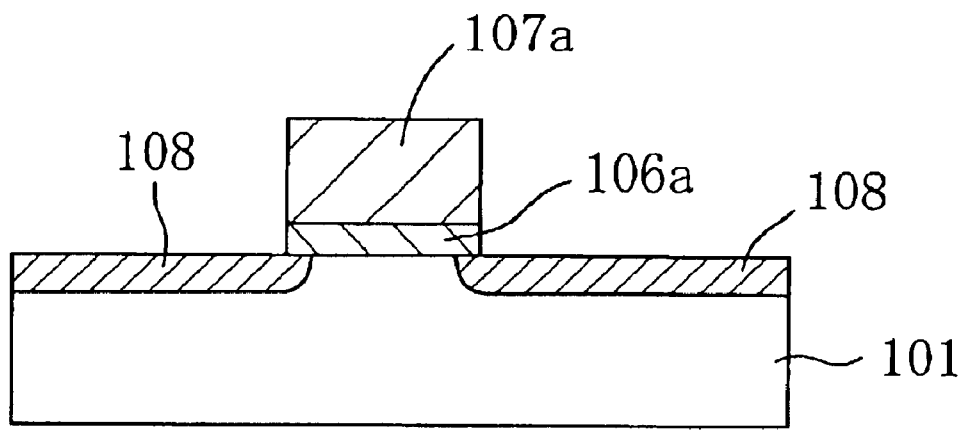

Next, in the process step of FIG. 2(b), the polysilicon film 107 and the high dielectric film 106 are patterned to form a gate electrode 107a and a gate insulating film 106a. Thereafter, ion implantation of the n-type impurity (e.g., arsenic) is performed in the nMISFET formation region from above the gate electrode 107a and ion implantation of the p-type impurity (e.g., boron) is performed in the pMISFET formation region from above the gate electrode 107a, thereby forming extension regions 108 which are doped with an impurity at a relatively high concentration on both sides of the gate electrode 107a in the silicon substrate.

Figure 2C:
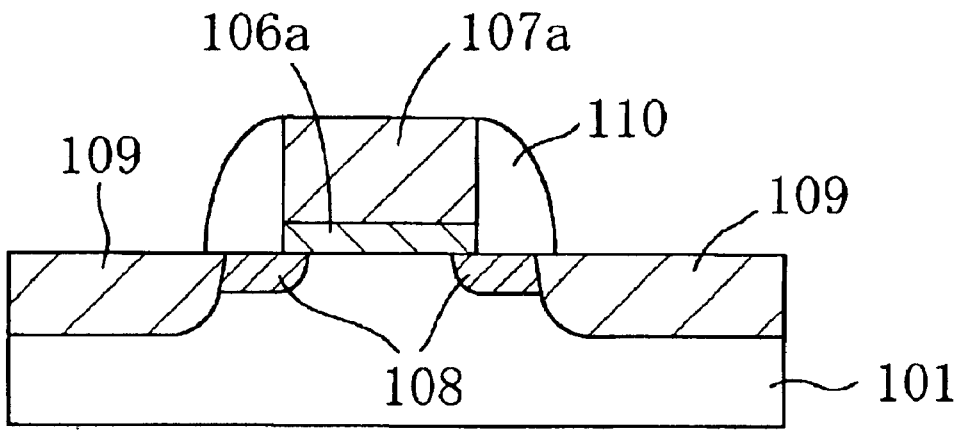

Next, in the process step shown in FIG. 2(c), oxide film sidewalls 110 are formed on side faces of the gate electrode 107a, and then ion implantation of the n-type impurity (e.g., arsenic) and ion implantation of the p-type impurity (e.g., boron) are performed in the nMISFET formation region and in the pMISFET formation region, respectively, from above the gate electrode 107a and the oxide film sidewalls 110 to form source/drain regions 109 which are doped with an impurity at a high concentration on both sides of the oxide film sidewalls 110 in the silicon substrate.

According to the foregoing process steps, an MISFET including the gate insulating film 106a having a high dielectric constant, obtained by Zr diffusion in the silicon oxide film, can be formed on the silicon substrate that is a p-type silicon substrate. Moreover, since the SiO₂ film 102 into which Zr has not yet been injected has been formed by thermal oxidation of a silicon substrate, a good state at the interface between the SiO₂ film 102 and the silicon substrate is maintained as it is at the interface between the gate insulating film 106a and the silicon substrate. Accordingly, the gate insulating film 106a of the present embodiment can achieve good properties at the interface between the gate insulating film 106a and the silicon substrate, in the same manner as an insulating film formed of an SiO₂ film.

FIRST MODIFIED EXAMPLE

In implanting Zr into the SiO₂ film in accordance with the present embodiment (the process step shown in FIG. 1(c)), a substrate bias means for adjusting the energy of Zr ions that is to be implanted into the SiO₂ film may be provided in the Zr plasma chamber shown in FIG. 4.

Figure 6:
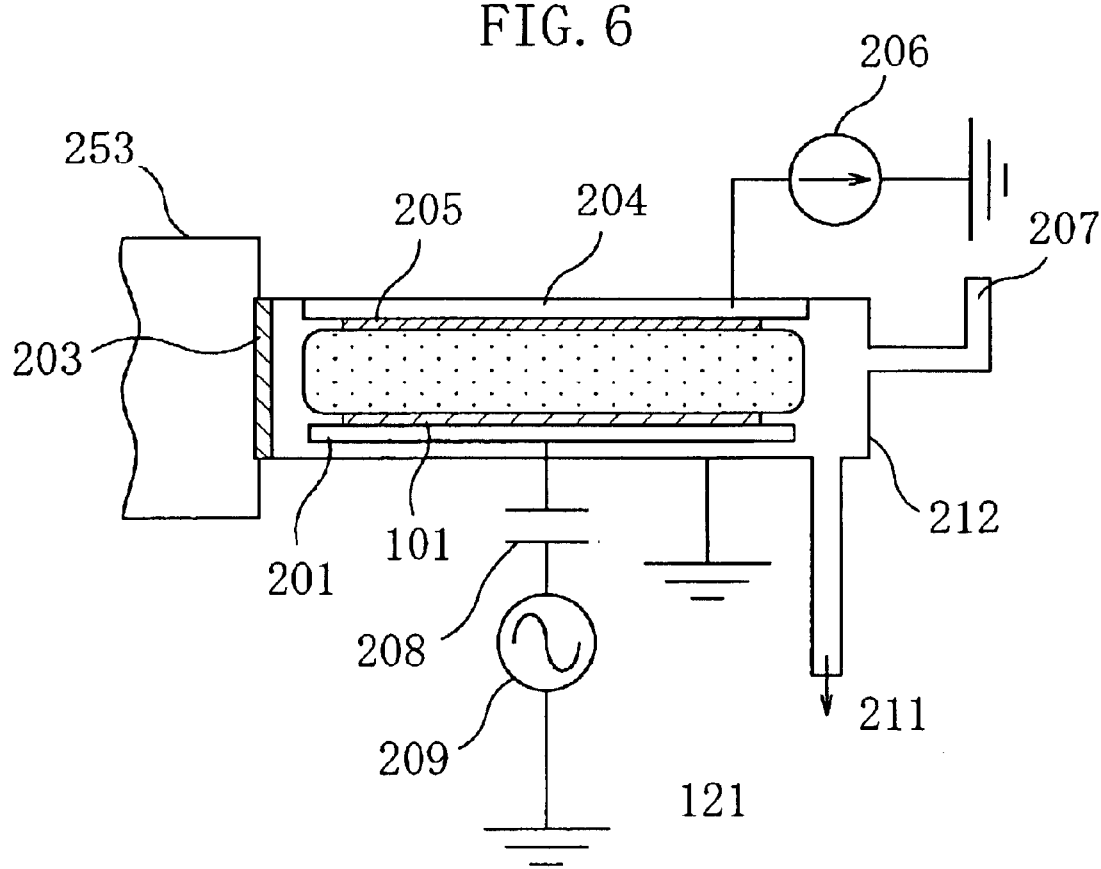
FIG. 6 is a cross-sectional view illustrating the structure of the chamber in which a substrate bias means is added according to a first modified example of the first embodiment.

FIG. 6 is a cross-sectional view illustrating the inside arrangement of the chamber 212 in which the substrate bias means are additionally provided in accordance with a first modified example of the present embodiment. According to the modified example, as shown in FIG. 6, a coupling condenser 208 and a high-frequency power source 209 for applying high frequency power exist between the wafer stage 201 and the ground. Other members shown in FIG. 11 are the same as those shown in FIG. 4 and identified by the same reference numerals as in FIG. 4. In the modified example, a high-frequency power of 13.56 MHz, for example, is applied by the high-frequency power source 209 and then Zr ions, accelerated by the power application, are implanted into the SiO₂ film. The injection dose and depth of Zr ions in the ion implantation can be controlled by the substrate bias power (e.g., 200 W to 800 W).

SECOND MODIFIED EXAMPLE

A plasma is used in the method for injecting Zr into the SiO₂ film according to the present embodiment. However, a general ion implantation method in which a plasma is not used may be used to inject Zr into the $SiO_2$ film.

FIGS. 7(a) through 7(d) are cross-sectional views illustrating process steps of fabricating a semiconductor device according to a second modified example of the present embodiment in which Zr is introduced into the $SiO_2$ film using a general ion implantation method.

Figure 7A:
FIGS. 7(a) through 7(d) are cross-sectional views illustrating part of process steps of fabricating a semiconductor device according to a second modified example of the first embodiment in which Zr is introduced into the $SiO_2$ film using a general ion implantation method.
Figure 7B:
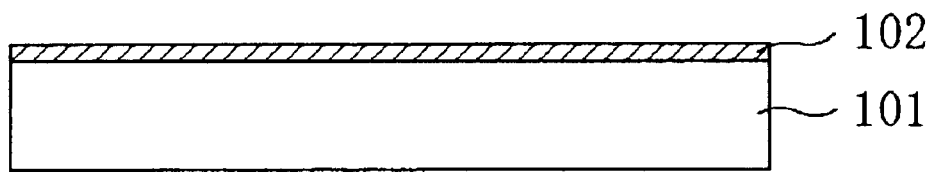

In the process steps shown in FIGS. 7(a) and 7(b), the same processes as those already described in FIGS. 1(a) and 1(b) are performed.

Figure 7C:
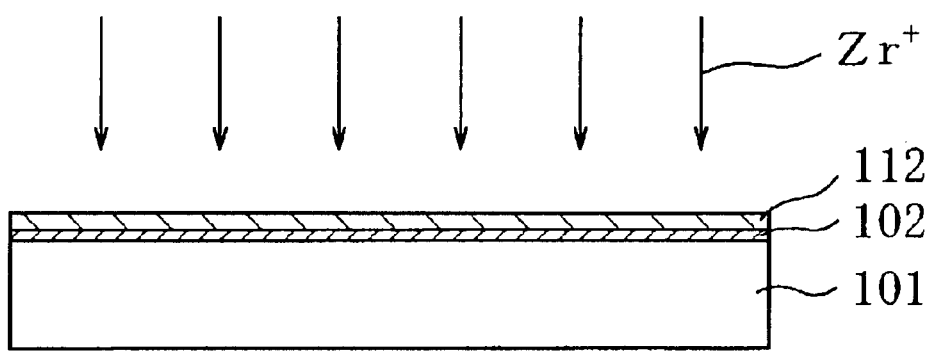

Then, in the process step shown in FIG. 7(c), using not a plasma but only a general ion implantation apparatus, Zr ions ($Zr^+$) are implanted into the $SiO_2$ film 102 to form a Zr injected layer 112.

Figure 7D:
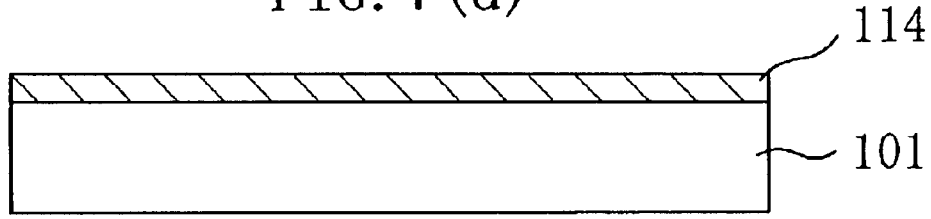

Then, in the process step shown in FIG. 7(d), Zr in the Zr injected layer 112 is diffused by annealing so that the $SiO_2$ film 102 and the Zr injected layer 103 are as a whole changed into silicate, thereby forming a high dielectric film 114.

Subsequent process steps will not be shown in figures. However, the same process steps as those shown in FIGS. 2(a) through 2(c) are performed to form an MIS transistor including a gate insulating film, a gate electrode, source/drain regions and the like.

Also, according to the present modified example, the high dielectric film, obtained by Zr diffusion in the silicon oxide film, is formed and then used as a gate insulating film, and thereby an MIS transistor which includes an gate insulating film generating less gate leakage current and which is suitable for size reduction is achieved.

In the present embodiment and each of the modified examples, Zr is used as an element that is to be diffused in the silicon oxide film so as to form a high dielectric film. However, even if Hf, Al or combination of Hf and Al is used instead of Zr, the same effects can be also achieved as in the present embodiment and each of the modified examples.

THIRD MODIFIED EXAMPLE

According to the present embodiment, Zr is injected into the $SiO_2$ film and then the entire $SiO_2$ film is changed into a silicate layer. However, only the upper part of the $SiO_2$ film may be changed into a silicate layer so that the $SiO_2$ film is left in the lower part thereof. Even in such a case, in the present embodiment, the silicate layer and the remaining $SiO_2$ film thereunder together are defined as a high dielectric film.

FIGS. 8(a) through 8(f) are cross-sectional views illustrating process steps of fabricating a semiconductor device according to a third modified example of the present embodiment in which only the upper part of the $SiO_2$ film is changed into a the silicate layer.

Figure 8A:
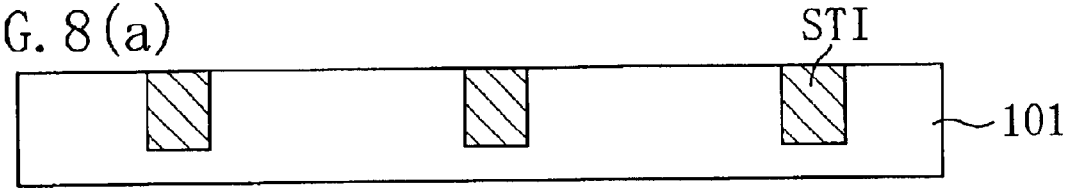
FIGS. 8(a) through 8(f) are cross-sectional views illustrating process steps of fabricating a semiconductor device according to a third modified example of the first embodiment in which only the upper part of the $SiO_2$ film is changed into the silicate layer.

First, in the process step shown in FIG. 8(a), a shallow trench isolation (STI) is formed in the p-type silicon substrate 101 in a wafer state so as to surround an activated region. Then, preliminary washing is performed for the silicon substrate 101 and then the silicon substrate 101 is loaded into the load-lock chamber 253 of the clustering apparatus.

Figure 8B:
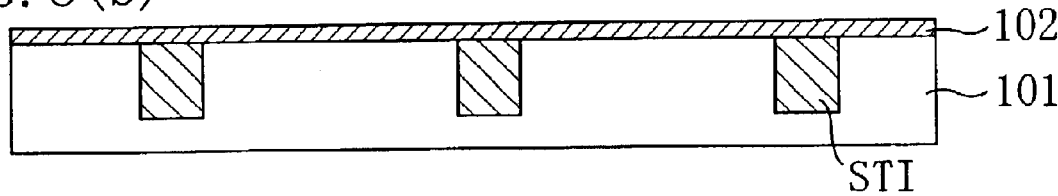

Next, in the process step shown in FIG. 8(b), the silicon substrate 101 is introduced into the high-speed oxidation furnace 201 and the $SiO_2$ film 102 having an optical film thickness of 5.0 nm is formed on the silicon substrate by thermal oxidation. In this case, $O_2$ gas is introduced into the furnace and thermal oxidation is carried out at 900° C. for 30 sec.

Figure 8C:
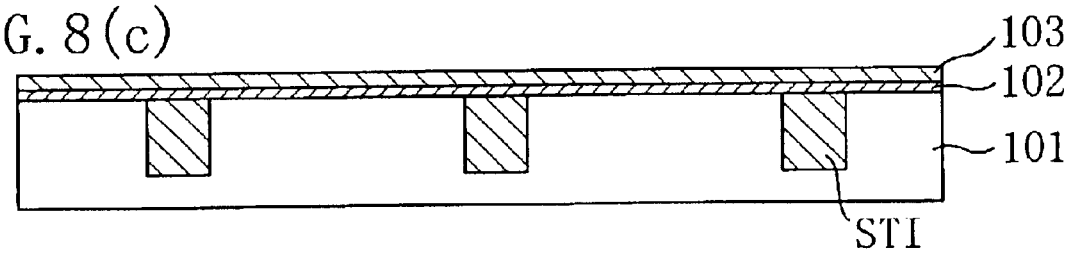

Subsequently, in the process step shown in FIG. 8(c), the silicon substrate 101 is transferred into the plasma generation chamber 252 and Zr ions ($Zr^+$) are introduced from a Zr plasma into the $SiO_2$ film 102.

The conditions adopted here are almost the same as in the first embodiment. However, in this case, if Zr ions are implanted into the $SiO_2$ film 102 to reach a depth of about 2 nm from the surface thereof with a slightly reduced bias applied, the upper part of the $SiO_2$ film 102 is changed into a Zr injected layer 103 that is an oxide silicon layer with a composition containing a large number of Zr atoms.

Figure 8D:
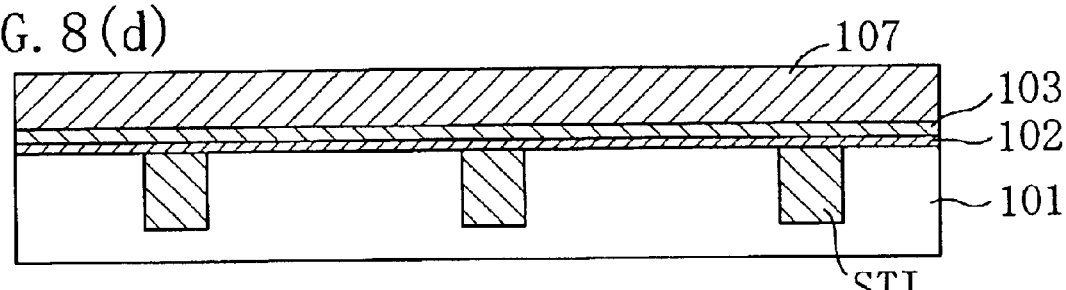

Next, in the process step shown in FIG. 8(d), the silicon substrate is removed from the clustering apparatus and transferred into the general purpose CVD chamber (not shown). Then, a polysilicon film 107 is deposited on the Zr injected layer 103 by CVD. Thereafter, according to the channel type of an MISFET to be formed, the polysilicon film 107 is doped with a p-type impurity such as boron (for pMISFET formation region) or an n-type impurity such as arsenic (for nMISFET formation region).

Figure 8E:
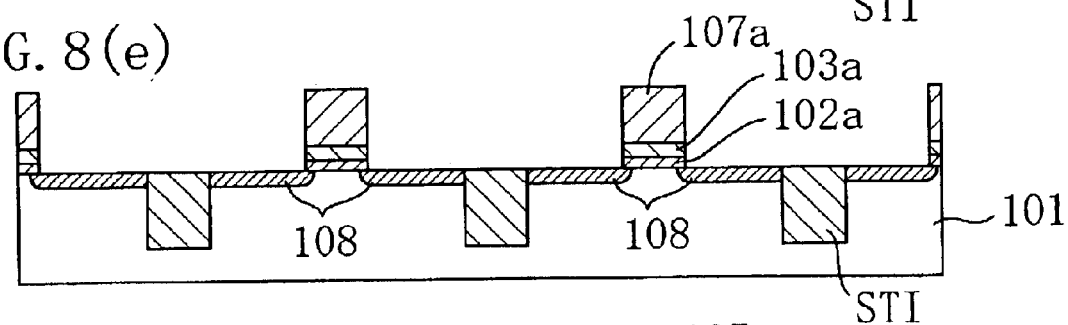

Next, in the process step shown in FIG. 8(e), the polysilicon film 107, the Zr injected layer 103 and the $SiO_2$ film 102 are patterned to form a gate electrode 107a, a Zr injection section 103a and a gate insulating film 116 (high dielectric film) composed of a low dielectric section 102a. Thereafter, ion implantation of the n-type impurity (e.g. arsenic) is performed from above the gate electrode 107a in the nMISFET formation region and ion implantation of the p-type impurity (e.g., boron) is performed from above the gate electrode 107a in the pMISFET formation region, thereby forming extension regions 108 which are doped with the impurity at a relatively high concentration on both sides of each gate electrode 107a in the silicon substrate.

Figure 8F:
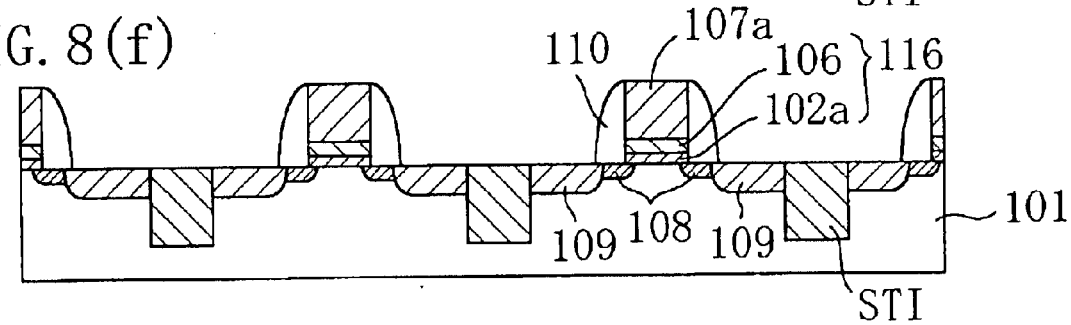

Next, in the process step shown in FIG. 8(f), oxide film sidewalls 110 are formed on side faces of the gate electrode 107a, ion implantation of the n-type impurity (e.g., arsenic) and ion implantation of the p-type impurity (boron) are performed in the nMISFET formation region and the pMISFET formation region, respectively, from above the gate electrode 107a and the oxide film sidewalls 110, thereby forming source/drain regions 109 which are doped with the impurity at a high concentration on both sides of the oxide sidewalls 110 in the silicon substrate.

Thereafter, RTA (rapid thermal annealing) is performed at 1000° C. for 10 sec to activate the impurity with which the extension regions 108 and the source/drain regions 109 have been doped has been doped, and at the same time the Zr injected section 103a is changed into a high dielectric section 106 of a high dielectric constant composed of Zr—Si—O (silicate). In other words, the gate insulating film 116 is finally composed of the high dielectric section 106 and the low dielectric section 102a. However, in the process step shown in FIG. 13(e), the Zr injected layer 103 and the $SiO_2$ film 102 need not necessarily be patterned.

According to the foregoing process steps, the gate insulating film 116 including the high dielectric section 106 of a high dielectric constant obtained by Zr diffusion and silication in the silicon oxide film, and the low dielectric section 102a composed of an $SiO_2$ film can be formed on the silicon substrate that is a p-type silicon substrate. Also according to the modified example, a good state at the interface between the $SiO_2$ film 102 that is a thermal oxide film and the silicon substrate is maintained as it is at the interface between the gate insulating film 116 and the silicon substrate.

According to the present embodiment, as characteristics of an n-channel FET, Ids=700 ($\mu$A) and gate leakage current Igieack<10 (pA/μm) were achieved when Vds=1.2 V Accordingly, with the MISFET of the present embodiment, it is possible to reduce the gate leakage current while maintaining a high driving power.

Note that the sidewalls and the extension regions are not necessarily needed in the MISFET of the present embodiment. Moreover, the nMISFET formation region and the pMISFET formation region have been isolated from each other by well injection in advance.

Second Embodiment

FIGS. 9(a) through 9(d) are cross-sectional views illustrating part of process steps of fabricating a semiconductor device according to a second embodiment of the present invention. In the present embodiment, almost the same apparatus as that of the first embodiment shown in FIGS. 3, 4 and 5 is used. However, a sputtering chamber is used instead of the high-speed oxidation furnace 251 shown in FIG. 3. Furthermore, instead of the Zr plasma generation chamber 252 shown in FIG. 4, an Si plasma generation chamber which has a similar structure to that of the Zr plasma generation chamber 252 but in which an Si target is disposed instead of the Zr target 204 is used.

Figure 9A:
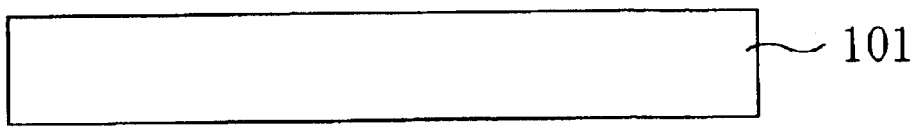
FIGS. 9(a) through 9(d) are cross-sectional views illustrating part of process steps of fabricating a semiconductor device according to a second embodiment.

First, in the process step shown in FIG. 9(a), a p-type silicon substrate 101 in a wafer state is prepared. Then, preliminary washing is performed for the silicon substrate and then the silicon substrate 101 is loaded into a load-lock chamber 253 of the clustering apparatus.

Figure 9B:
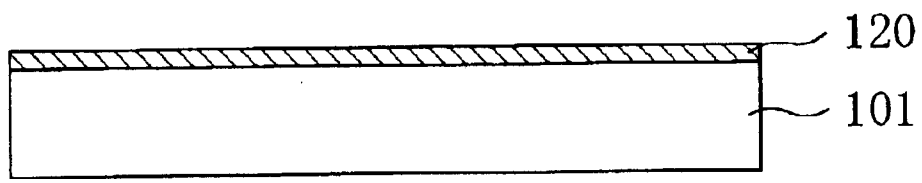

Next, in the process step shown in FIG. 9(b), the silicon substrate is introduced into the sputtering chamber and then Zr is sputtered from the Zr sputter target onto the silicon substrate 101 at a substrate temperature of about 400° C. and in an $O_2$/Ar atmosphere, thereby forming a $ZrO_2$ film 120 having an optical film thickness of 5.0 nm on the silicon substrate 101.

Figure 9C:
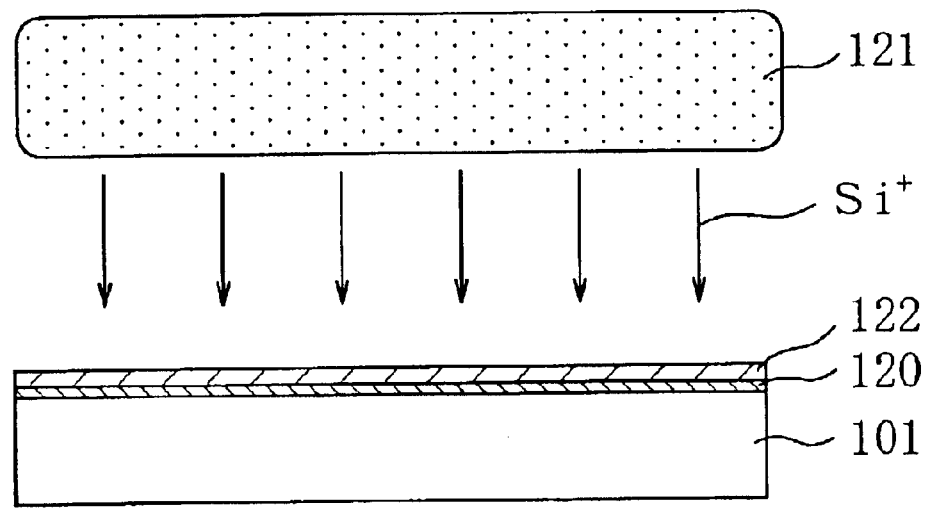

Subsequently, in the process step shown in FIG. 9(c), the silicon substrate 101 is transferred into the Si plasma generation chamber. Then, Si atoms and ions are sputtered from the Si target to introduce the atoms and the ions into a plasma 121. Furthermore, in the Si plasma generation chamber, a substrate bias of 600 W high-frequency power at a frequency of 13.56 MHz is applied so that the Si ions ($Si^+$) in the plasma 121 are accelerated and then introduced into the $ZrO_2$ film 120, thereby the upper part of the $ZrO_2$ film 120 is changed into an Si injected layer 122. At this time, in the Si plasma generation chamber, under the conditions where the flow rate of Ar gas is 80 sccm and the pressure of the inside of the chamber is 100 mTorr ($\approx$13.3 Pa), a bias of 1 kV is applied from a bias source to the Si target to perform plasma treatment for about 30 sec. Even if the plasma treatment is carried out with the substrate bias applied in the pulse application system, the same result will be obtained.

Figure 9D:
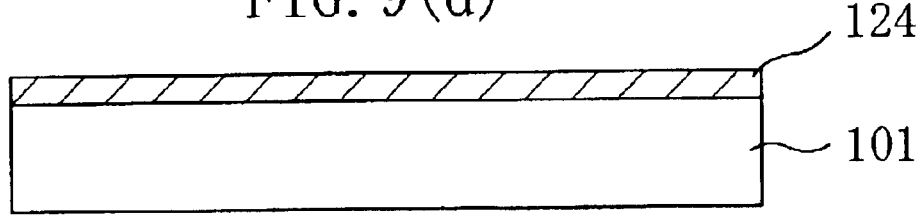

Next, in the process step shown in FIG. 9(d), in a high-speed heat treatment furnace 254, the $ZrO_2$ film 120 and the Si injected layer 122 are annealed at 650° C. for 10 sec. Injected Si is diffused due to the annealing and the $ZrO_2$ film 120 and the Si injected layer 122 are as a whole changed into a high dielectric film 124 of a high dielectric constant composed of Zr—Si—O (silicate).

In this case, it is known that particularly good properties can be achieved by performing an annealing process at a temperature that does not exceed a recrystallization temperature. Moreover, heat treatment is performed in an oxidizing atmosphere, so that the Si—O content is increased around the surface of the silicon substrate 101 in the high dielectric film 124 that has been changed into silicate, and thereby an MIS transistor with a low interface state density at the silicon substrate 101 (specifically in the channel region) can be formed.

Subsequent process steps will not be shown in figures. However, the same process steps as those shown in FIGS. 2(a) through 2(c) are performed to form an MIS transistor including a gate insulating film, a gate electrode, source/drain regions and the like.

According to the present embodiment, since Si is injected into the $ZrO_2$ film, it is possible to easily and stably form a silicate layer composed of Zr—Si—O while preventing reclystallization of $ZrO_2$. Furthermore, O can be injected with Si, and therefore a required composition can be controlled with high accuracy by changing the injection doses. Also, according to the present embodiment, the high dielectric film 124 is used as the gate insulating film, and thereby an MIS transistor which includes an gate insulating film generating less gate leakage current and which is suitable for size reduction can be achieved.

A plasma is used in injecting Si into the $ZrO_2$ film according to the present embodiment. However, even if Si ions are injected into the $ZrO_2$ film using a general ion implantation method, the same effects as in the present embodiment can be achieved.

FIGS. 10(a) through 10(d) are cross-sectional views illustrating process steps of fabricating a semiconductor device according to a modified example of the present embodiment, in which Zr is introduced into an $SiO_2$ film using a general ion implantation method.

Figure 10A:
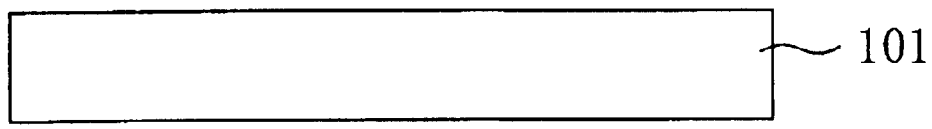
FIGS. 10(a) through 10(d) are cross-sectional views illustrating part of process steps of fabricating a semiconductor device according to modified examples of the second embodiment in which Zr is introduced into the $SiO_2$ film using a general ion implantation method.
Figure 10B:
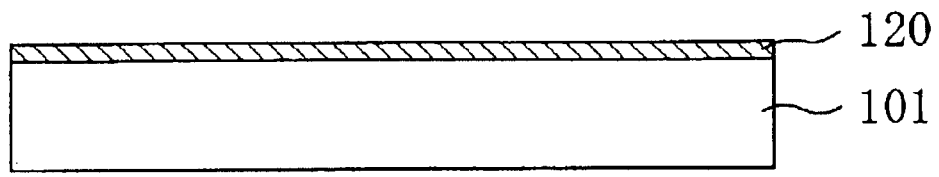

In the process steps shown in FIGS. 10(a) and 10(b), the same process steps as those already described in FIGS. 8(a) and 8(b) are performed.

Figure 10C:
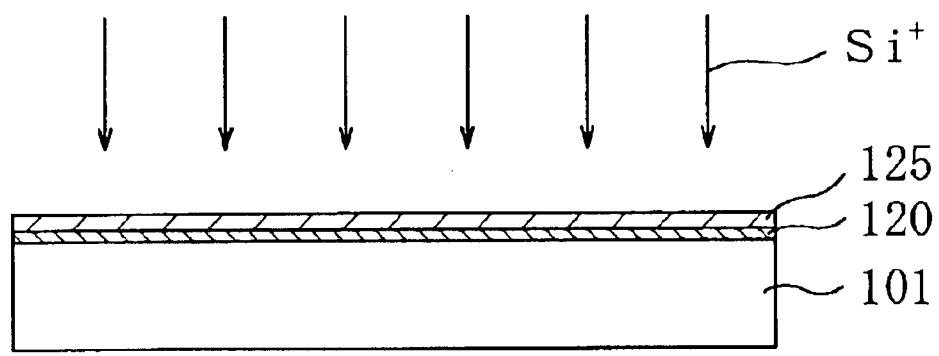

Then, in the process step shown in FIG. 10(c), using not a plasma but only a general ion implantation apparatus, Si ions ($Si^+$) are implanted into the $ZrO_2$ film 120 to form an Si injected layer 125.

Figure 10D:
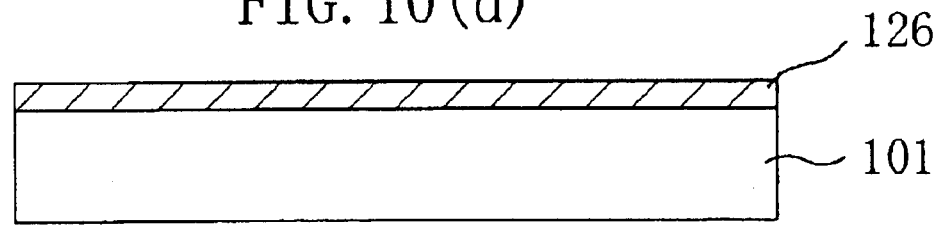

In the process step shown in FIG. 10(d), Si is diffused in the high-speed heat treatment furnace 254 by annealing to form a high dielectric film 126.

Subsequent process steps will not be shown in figures. However, the same process steps as those shown in FIGS. 2(a) through 2(c) are performed to form an MIS transistor including a gate insulating film, a gate electrode, source/drain regions and the like.

Also, according to the present modified example, the high dielectric film, obtained by Zr diffusion in the silicon oxide film, is formed and then used as a gate insulating film, and thereby an MIS transistor which includes a gate insulating film generating less gate leakage current and which is suitable for size reduction is achieved.

Third Embodiment

FIGS. 11(a) through 11(e) are cross-sectional views illustrating part of process steps of fabricating a semiconductor device according to a third embodiment of the present invention. In the present embodiment, almost the same apparatus as that of the first embodiment shown in FIGS. 3, 4 and 5 is used. However, instead of the clustering apparatus shown in FIG. 3, a clustering apparatus including a sputtering chamber is used in the present embodiment. Furthermore, instead of the Zr plasma generation chamber 252 shown in FIG. 4, an Si plasma generation chamber which has a similar structure to that of the Zr plasma generation chamber 252 but in which an Si target is disposed instead of the Zr target 204 is used.

Figure 11A:
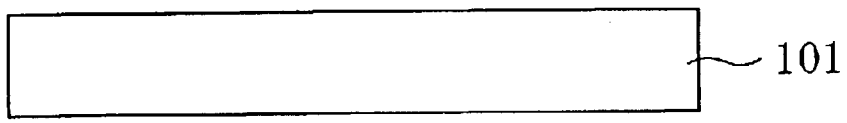
FIGS. 11(a) through 11(e) are cross-sectional views illustrating part of process steps of fabricating a semiconductor device according to a third embodiment.

First, in the process step shown in FIG. 11(a), a p-type silicon substrate 101 in a wafer state is prepared. Then, preliminary washing is performed for the silicon substrate 101 and then the silicon substrate 101 is loaded into a load-lock chamber 253 of the clustering apparatus.

Figure 11B:
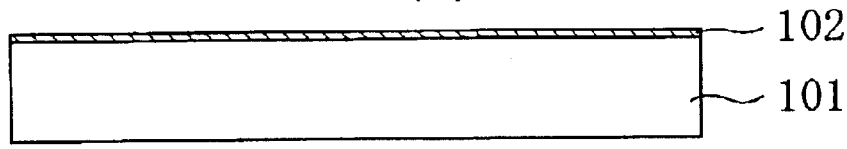

Next, in the process step shown in FIG. 11(b), the silicon substrate 101 is introduced into a high-speed oxidation furnace 201 and an SiO₂ film 102 having an optical film thickness of about 1.0 nm is formed on the substrate by thermal oxidation. In this case, O₂ gas is introduced into the furnace and thermal oxidation is performed at 900° C. for 10 sec.

Figure 11C:
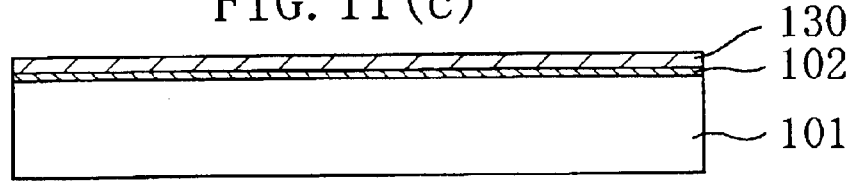

Next, in the process step shown in FIG. 11(c), the silicon substrate 101 is introduced into the sputtering chamber and then Zr is sputtered from the Zr sputter target onto the silicon substrate 101 at a substrate temperature of about 400° C. and in an O₂/Ar atmosphere, thereby forming a ZrO₂ film 130 having an optical thickness of 5.0 nm on the SiO₂ film 102.

Figure 11D:
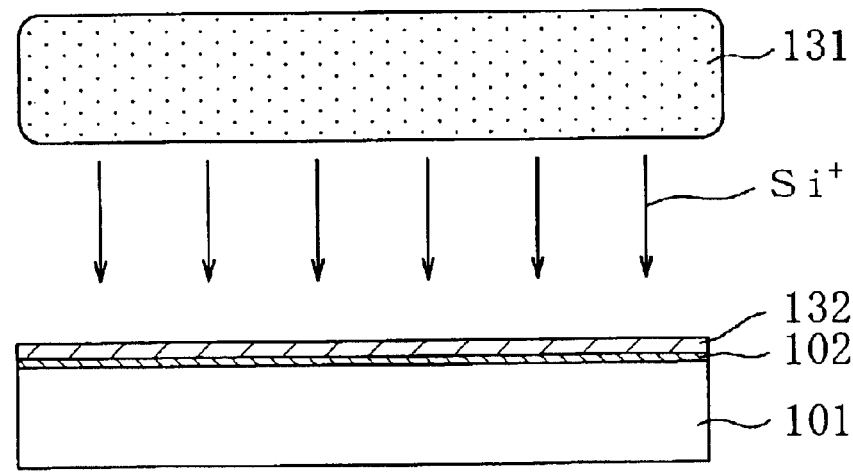

Subsequently, in the process step shown in FIG. 11(d), the silicon substrate 101 is transferred into the Si plasma generation chamber. Then, Si atoms and ions are sputtered from the Si target to introduce the atoms and ions into a plasma 131. Furthermore, in the Si plasma generation chamber, a substrate bias of 600 W of high-frequency power at a frequency of 13.56 MHz is applied so that the Si ions (Si⁺) in the plasma 131 are accelerated and then introduced into the ZrO₂ film 130, thereby the ZrO₂ film 130 is changed into a Si injected layer 132. At this time, in the Si plasma generation chamber, under the conditions where the flow rate of Ar gas is 80 sccm and the pressure of the inside of the chamber is set at 100 mTorr (≈13.3 Pa), a bias of 1 kV is applied from a bias source to the Si target to perform plasma treatment for about 30 sec. Even if the plasma treatment is carried out with the substrate bias in the pulse application system applied, the same result will be obtained.

Figure 11E:
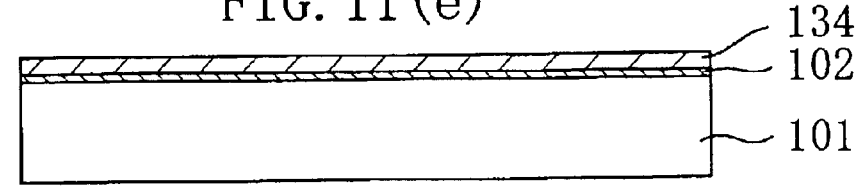

Next, in the process step shown in FIG. 11(e), the SiO₂ film 102 and the Si injected layer 132 are annealed at 650° C. for 10 sec. By the annealing, Si that has been injected in the layer is diffused, and the entire Si injected layer 132 is changed into a silicate layer 134 composed of Zr—Si—O having a high dielectric constant. That is to say, the high dielectric film composed of a layered film of the SiO₂ film 102 and the silicate layer 134 is formed on the silicon substrate.

In this case, it is known that, particularly good properties can be achieved by performing an annealing process at a temperature that does not exceed a recrystallization temperature (about 700° C. for the silicate layer 134 composed of Zr—Si—O).

Subsequent process steps will not be shown in figures. However, the same process steps as those shown in FIGS. 2(a) through 2(c) are performed to form an MIS transistor including a gate insulating film formed of a layered film of the SiO₂ film 102 and the silicate layer 134, a gate electrode, source/drain regions and the like.

According to the present embodiment, the SiO₂ film is provided as a base and Si is injected into the ZrO₂ film located thereon, and thus the SiO₂ film serves as a buffer layer in implanting Si ions. Accordingly, prevention of occurrence of damages to the silicon substrate 101 can be ensured and also the same effects can be achieved as the second embodiment at the same time. Furthermore, O can be injected with Si, and therefore a required composition can be controlled with high accuracy by changing the injection doses. Also, according to the present embodiment, the high dielectric film formed of a layered film of the SiO₂ film 102 and the silicate layer 134 is used as a gate insulating film, and thereby an MIS transistor which includes an gate insulating film generating less gate leakage current and which is suitable for size reduction can also be achieved.

Specifically, in the present embodiment, since the SiO₂ film exists under the silicate layer 134, it is preferable that the silicate layer 134 has a great thickness in order to suppress the decrease in dielectric constant of the entire gate insulating film.

A plasma is used in injecting Si into the ZrO₂ film according to the present embodiment. However, even if Si is injected into the ZrO₂ film using a general ion implantation method, the same effects as in the present embodiment can be achieved.

Alternatively, a Zr film, instead of the ZrO₂ film, may be formed, and Si ions, or Si ions and oxygen ions may be implanted into the Zr film.

Furthermore, an HfO₂ film or an Hf film, or an Al₂O₃ film or an Al film may be used, instead of the ZrO₂ film of the present embodiment. In that case, a ZrO₂ film, instead of the SiO₂ film, may be used as a base film.

Fourth Embodiment

FIGS. 12(a) through 12(e) are cross-sectional views illustrating part of process steps of fabricating a semiconductor device according to a fourth embodiment of the present invention. In the present embodiment, almost the same apparatus as that of the first embodiment shown in FIGS. 3, 4 and 5 is used. However, a Zr sputtering chamber in which a Zr target is disposed is used in the present embodiment.

Figure 12A:
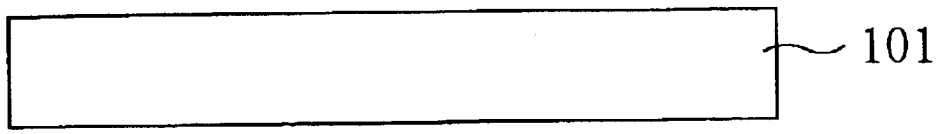
FIGS. 12(a) through 12(d) are cross-sectional views illustrating part of process steps of fabricating a semiconductor device according to a fourth embodiment.

First, in the process step shown in FIG. 12(a), a p-type silicon substrate 101 in a wafer state is prepared. Then, preliminary washing is performed for the silicon substrate and then the silicon substrate 101 is loaded into a load-lock chamber 253 of the clustering apparatus.

Figure 12B:
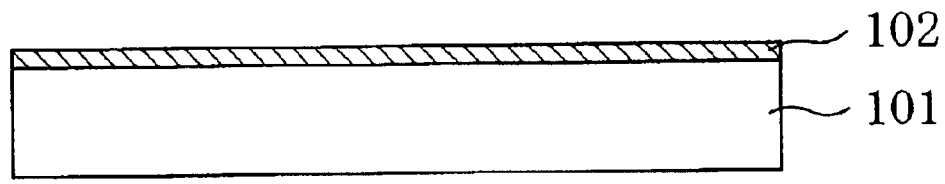

Next, in the process step shown in FIG. 12(b), the silicon substrate 101 is introduced into a high-speed oxidation furnace 201 and an SiO₂ film 102 having an optical film thickness of about 3.0 nm is formed on the substrate by thermal oxidation. In this case, O₂ gas is introduced into the furnace and thermal oxidation is performed at 900° C. for 30 sec.

Figure 12C:
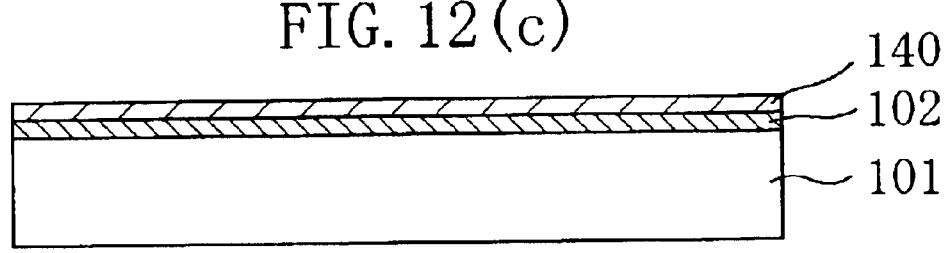

Subsequently, in the process step shown in FIG. 12(c), the silicon substrate 101 is introduced into the sputtering chamber and then Zr is sputtered from the Zr sputter target onto the silicon substrate 101 at a substrate temperature of about 400° C. and in an O₂/Ar atmosphere, thereby forming a ZrO₂ film 140 having an optical thickness of 3.0 nm on the SiO₂ film 102.

Figure 12D:
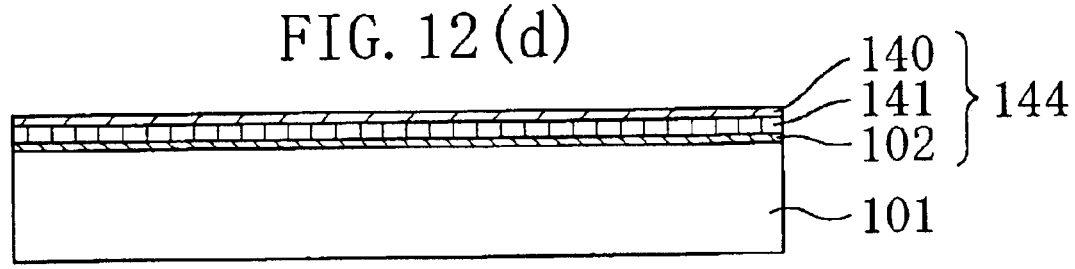

Next, in the process step shown in FIG. 12(d), Si in the SiO₂ film 102 and Zr in the ZrO₂ film 140, which have gone through heat treatment at 650° C. for 60 sec, are solid-phase-diffused. By this heat treatment, an $Si_xZr_yO_{1-x-y}$ layer 141 is formed between the SiO₂ film 102 and the ZrO₂ film 140. In this case, it is preferable that the thickness of the SiO₂ film 102 is about 1.5 Å. A high dielectric film 144 is composed of the entire layered film formed of the SiO₂ film 102 and the $Si_xZr_yO_{1-x-y}$ layer 141.

In this case, it is known that particularly good properties can be achieved by performing an annealing process at a temperature that does not exceed a recrystallization temperature (about 700° C. for a silicate layer composed of $Si_xZr_yO_{1-x-y}$).

Subsequent process steps will not be shown in figures. However, the same process steps as those shown in FIGS. 2(a) through 2(c) are performed, thereby forming an MIS transistor including a gate insulating film formed of the high dielectric film 144 composed of a layered film of the SiO₂ film 102 and the $Si_xZr_yO_{1-x-y}$ layer 141, a gate electrode, source/drain regions and the like.

According to the present embodiment, the SiO₂ film 106 is provided as a base and the $Si_xZr_yO_{1-x-y}$ layer 141 is formed by solid-phase diffusion between the SiO₂ film 106 and the ZrO₂ film 140. Then, the entire layered film formed of the SiO₂ film 106, the ZrO₂ film 140 and the $Si_xZr_yO_{1-x-y}$ layer 141 serves as a high dielectric film 144. The remaining SiO₂ film 120 prevents the occurrence of an interface state at the interface between the high dielectric film 144 and the silicon substrate 101. Accordingly, reduction in mobility due to scattering of carriers caused by the interface state can be suppressed with the MIS transistor in operation and also the same effects as in the first embodiment can be achieved.

Also according to the present embodiment, by using the layered film of the $SiO_2$ film 102 and the high dielectric film 134 as a gate insulating film, an MIS transistor which includes an gate insulating film generating gate leakage current and which is suitable for size reduction is achieved.

Alternatively, a Zr film, instead of the $ZrO_2$ film, may be formed to lead solid-phase diffusion between the Zr film and the $SiO_2$ film.

Characteristics of MIS Transistors According to Each Embodiment

Figure 13:
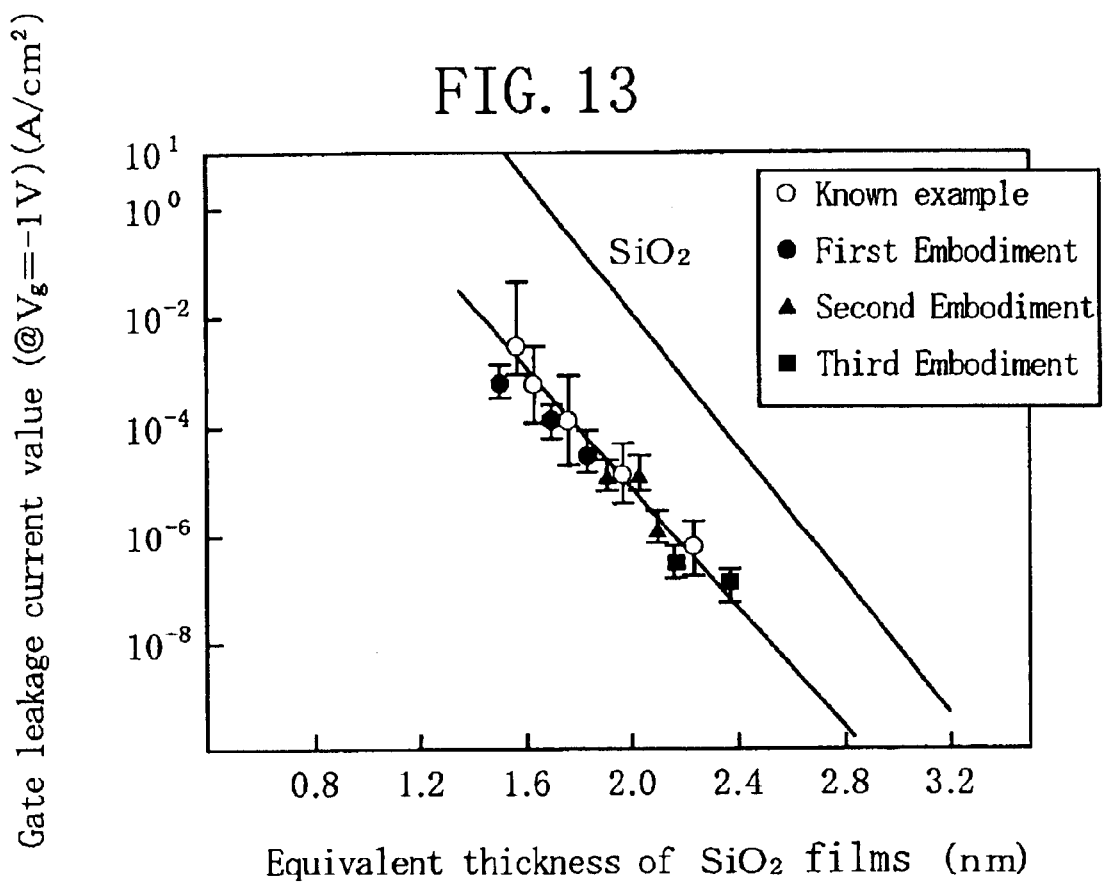
FIG. 13 is a graph showing the results of evaluations of electric properties (i.e., values of gate leakage current) of the structure in which extension regions have not yet been formed, i.e., an MIS capacitor, using the gate insulating films in accordance with the respective embodiments.

FIG. 13 is a graph showing the results obtained by evaluating electric properties (i.e., values of gate leakage current) of the structures of the respective embodiments in which the extension regions 108 shown in FIG. 2(b) have not yet been formed, i.e., MIS capacitors, using the gate insulating films in accordance with the respective embodiments. The abscissa of FIG. 13 indicates the thickness of the gate insulating film in terms of the $SiO_2$ film while the ordinate of FIG. 13 indicates the gate leakage current level when the voltage applied to the gate insulating film is 1 V. In FIG. 13, ○ indicates the data obtained when a known gate insulating film (a silicate film formed by a plasma CVD method or a DC sputtering method) is used, ● indicates the data obtained when the gate insulating film of the first embodiment is used, ▼ indicates the data obtained when the gate insulating film of the second embodiment is used, and ■ indicates the data obtained when the gate insulating film of the third embodiment is used.

As can be seen from FIG. 13, in the cases of the MIS capacitors using the gate insulating films of the embodiments of the present invention, variations of electric properties (gate leakage properties) are reduced by nearly one order of magnitude, compared to the case of one using the known silicate film formed by the plasma CVD method or the DC sputtering method as an gate insulating film. Moreover, it was also found that the dielectric constant of the insulating film of the first embodiment is 15, that the dielectric constant of the insulating film of the second embodiment is 14, and that the dielectric constant of the third embodiment is 14. These values for the dielectric constant are smaller than the value for the dielectric constant of an ideal $ZrO_2$ film (>20), but the values are about four times greater than 3.9, which is the value for the dielectric constant of a normal $SiO_2$ film.

Note that in forming the $SiO_2$ film by thermal oxidation according to the first, third and fourth embodiments, the thermal oxidation may be performed in a nitrogen-containing atmosphere to form a silicon oxynitride film.

Fifth Embodiment

FIGS. 14(a) through 14(e) are cross-sectional views illustrating part of process steps of fabricating a semiconductor device according to a fifth embodiment.

Figure 14A:
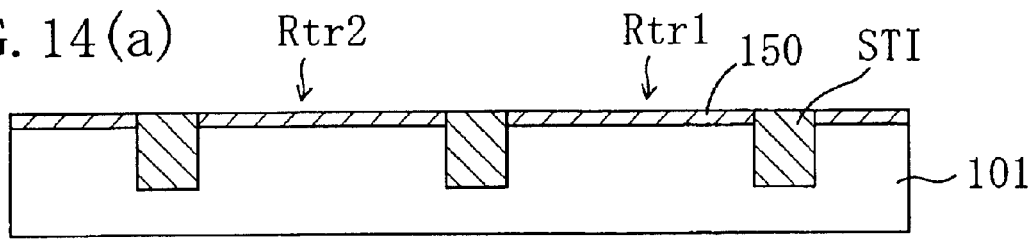
FIGS. 14(a) through 14(e) are cross-sectional views illustrating process steps of fabricating a semiconductor device according to a fifth embodiment.

First, in the process step shown in FIG. 14(a), a shallow trench isolation (STI) is formed in a p-type silicon substrate 101 in a wafer state so as to surround an activated region. Then, preliminary washing is performed for the silicon substrate 101 and then a silicon oxynitride film 150 having an optical film thickness of 2.6 nm is formed on the silicon substrate by thermal oxynitridation. In this case, with the inside of a furnace put under an atmosphere of a mixture gas containing NO and $O_2$ (mixture ratio: 1:1), thermal oxynitridation is carried out at 1050° C.

Figure 14B:
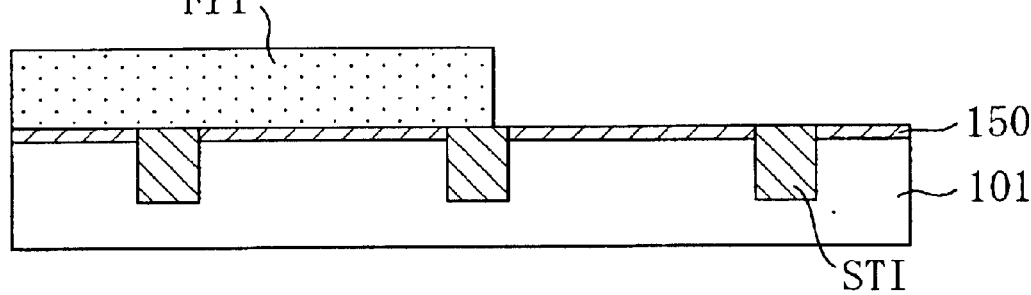

Next, in the process step shown in FIG. 14(b), a photoresist film Fr1 is formed over the substrate to open a region Rtr1 of the silicon oxynitride film 150, in which a first transistor which is required to operate at a high speed is to be formed, and to cover the other regions. The regions other than Rtr1 include a region Rtr2 in which a second transistor which is required to have high reliability and operate with low-power consumption is to be formed. A region (not shown) in which a transistor disposed in an I/O section is to be formed is also covered with the photoresist film Fr1.

Figure 14C:
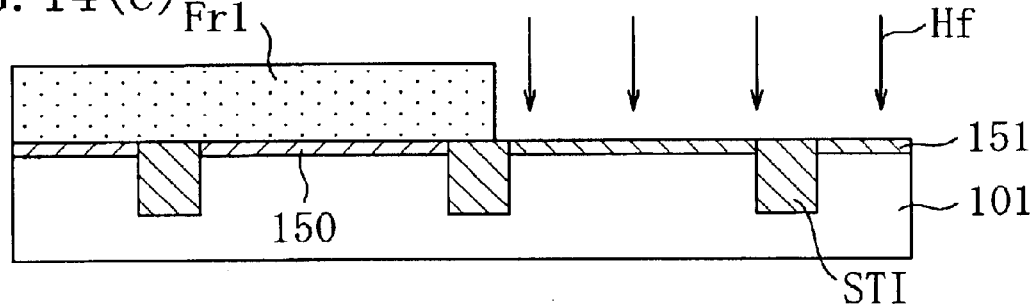

Subsequently, in the process step shown in FIG. 14(c), Hf ions ($Hf^+$) are introduced in only the region of the silicon oxynitride film 150 which is located in the first transistor formation region Rtr21. At this time, Hf ions may be introduced into the silicon oxynitride film 150 either by an ion implantation method or using a plasma. By this process, an Hf injected layer 151, which is a silicon oxynitride film with a composition containing a large number of Hf atoms, is formed in part of the silicon substrate 101. In FIG. 14(c), the Hf injected layer 151 is drawn such that the Hf injected layer 151 seems to be formed throughout the silicon oxynitride layer in the thickness direction. However, the silicon oxynitride film may be left under the Hf injected layer 151 as shown in FIG. 1(c).

Figure 14D:
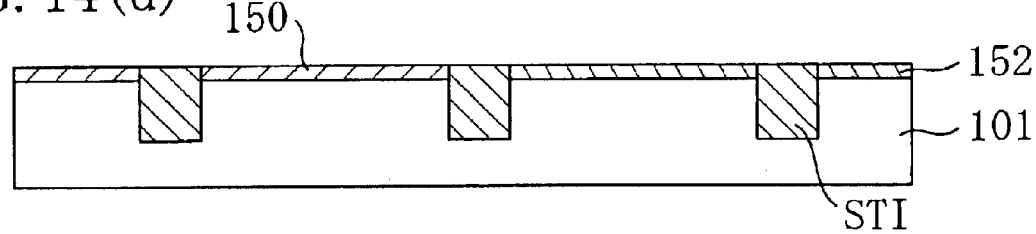

Next, in the process step shown in FIG. 14(d), the photoresist film Fr1 is removed by ashing. Thereafter, RTA (rapid thermal annealing) is carried out at 650° C. for 10 sec in an $N_2$ atmosphere to anneal the Hf injected layer 151. By the annealing process, Hf is diffused in the Hf injected layer 151, and the Hf injected layer 151 is changed into a high dielectric film 152 having a high dielectric constant, composed of Hf—Si—N—O (silicate).

In the process step shown in FIG. 14(c), even if the silicon oxynitride film is left under the Hf injected layer 151 as shown in FIG. 1(c), Hf, in general, is diffused in both of the Hf injected layer 151 and the remaining silicon oxynitride film thereunder.

However, without Hf being diffused throughout the thickness of the silicon oxynitride film remaining under the Hf injected layer 151, the silicon oxynitride film may be left under the silicate layer formed of Hf—Si—O. Even in such a case, in the present embodiment, the silicate layer and the silicon oxynitride film are as a whole defined as the high dielectric film 152.

Figure 14E:
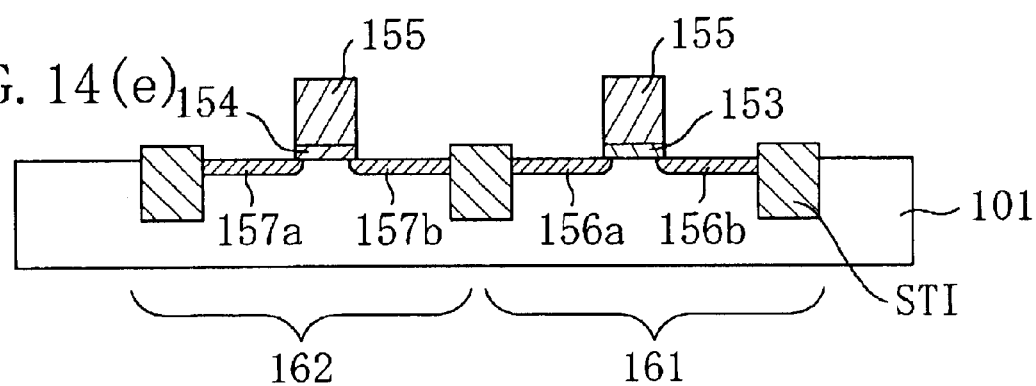

Next, in the process step shown in FIG. 14(e), a polysilicon film is deposited on the silicon oxynitride film 105 and the high dielectric film 152 by CVD. Thereafter, according to the channel type of an MISFET to be formed, the polysilicon film is doped with a p-type impurity such as boron (for pMISFET formation region) or an n-type impurity such as arsenic (for nMISFET formation region).

Next, the polysilicon film, the high dielectric film 152 and the silicon oxynitride film 150 are patterned to form a gate electrode 155, an gate insulating film 153 composed of the high dielectric film 152, and an gate insulating film 154 composed of the silicon oxynitride film 150. Thereafter, ion implantation of the n-type impurity (e.g., arsenic) is performed from above the gate electrode 155 in the nMISFET formation region and ion implantation of the p-type impurity (e.g., boron) is performed from above the gate electrode 155 in the pMISFET formation region. In this manner, in the first transistor formation region Rtr1, extension regions 156a, 156b which are doped with the impurity at a relatively high concentration are formed on both sides of the gate electrode 155 in the silicon substrate 101. On the other hand, in the second transistor formation region Rtr2, extension regions 157a, 157b which are doped with an impurity at a relatively high concentration are formed on both sides of the gate electrode 155 in the silicon substrate 101.

Subsequent process steps will not be shown in figures. However, sidewalls are formed on side faces of the gate electrode 155 and then impurity is ion-implanted at a high concentration using the gate electrode 155 and the sidewalls as a mask, thereby forming a heavily doped source/drain regions for each MISFET in each of the transistor formation regions Rtr1 and Rtr2.

Then, a first transistor 161 including the gate insulating film 153 composed of the high dielectric film 152 is formed in the first transistor formation region Rtr1, and a second transistor 162 including the gate insulating film 154 composed of the silicon oxynitride film 151 is formed in the second transistor formation region Rtr2.

However, in the process step shown in FIG. 14(e), the high dielectric film 152 and the silicon oxynitride film 1580 need not necessarily be patterned.

Alternatively, without performing heat treatment for Hf diffusion in the process step shown in FIG. 14(c), heat treatment may be performed to diffuse Hf in activating the impurities which have been implanted into the extension regions and the source/drain regions.

In the MISFET of the present embodiment, the sidewalls and extension regions are not necessarily needed.

Figure 15:
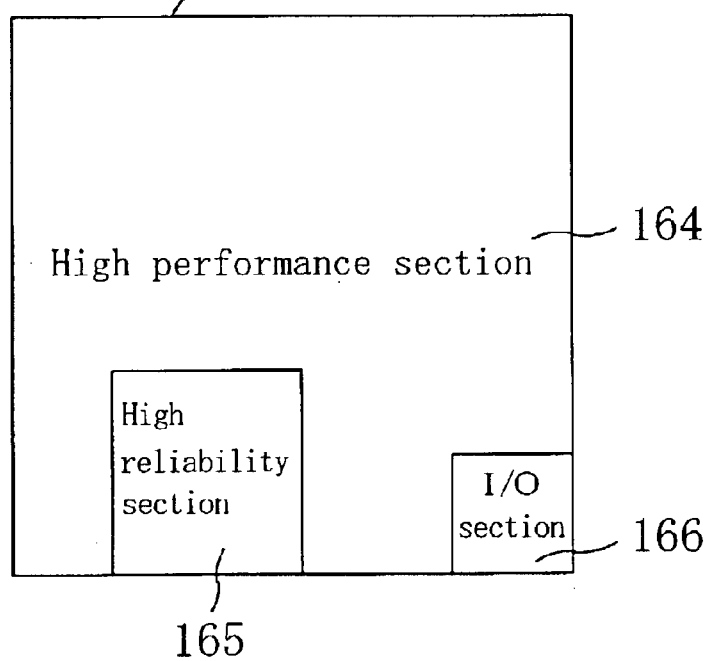
FIG. 15 is a plane view illustrating a system LSI formed by the fabrication method of a fifth embodiment.

FIG. 15 is a plane view illustrating a system LSI that is formed according to the fabrication method of the present embodiment. As shown in FIG. 15, the system LSI includes a high performance section 164 in which the first transistor 161 required to operate at a high speed is disposed, a high reliability section 165 in which the second transistor 162 required to have high reliability and operate with low power consumption is disposed, and an I/O section 166. In this case, a transistor which is disposed in the I/O section 166 is composed of an MIS transistor in which a thick silicon oxynitride film having a thickness of 7 nm in terms of physical film thickness serves as a gate insulating film.

According to the fabrication method of the present embodiment, the first transistor 161 including the gate insulating film 153 formed of the high dielectric film 152 which has a high dielectric constant and which is obtained by Hf diffusion and silication in the silicon oxynitride film, and the second transistor 162 including the gate insulating film 154 formed of the silicon oxynirtide film 150 can be formed. In the high dielectric film 152, a good state at the interface between the silicon oxynitride film 150 and the silicon substrate 101 is maintained as it is at the interface between the gate insulating film 153 and the silicon substrate 101. Therefore, the deterioration of gate leakage properties can be prevented.

Figure 16:
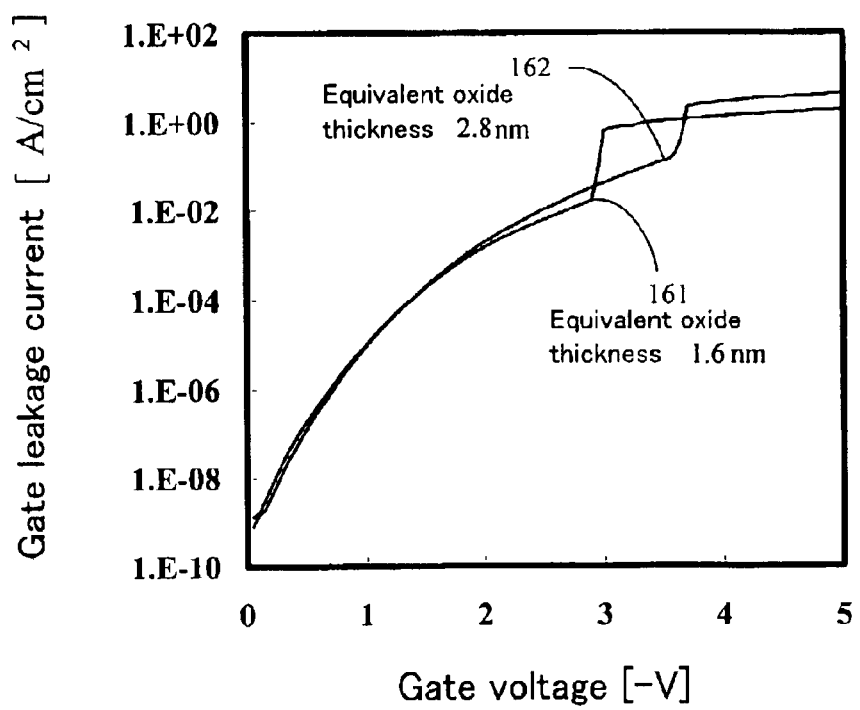
FIG. 16 is a graph showing the dependency of the gate leakage current (i.e., leakage current at a stand-by state) on the gate voltage in the first and second transistors of the fifth embodiment.

FIG. 16 is a graph showing the dependency of the gate leakage current (leakage current at a stand-by state) in the first transistor 161 and the second transistor 162 on the gate voltage. The first transistor 161 had a thickness of about 1.6 nm and the second transistor 162 had a thickness of about 2.8 nm, each in terms of equivalent oxide thickness. In other words, it can be seen that in terms of the equivalent oxide thickness, the thickness of the gate insulating film 153 (the high dielectric film 152) of the first transistor 161 were reduced by the increase in dielectric constant. On the other hand, the gate leakage properties of the gate insulating film 153 of the first transistor 161 was not noticeably worsened by introducing a metal. This is because, in terms of physical film thickness, the thickness of the high dielectric film 152 was increased to be greater than that of the silicon oxynitride film 150. It is obvious that if the gate insulting film having a thickness of 1.6 nm in terms of equivalent oxide thickness is formed of a silicon oxide film or a silicon oxynitride film, the gate leakage properties will be deteriorated to a further extent.

Figure 17:
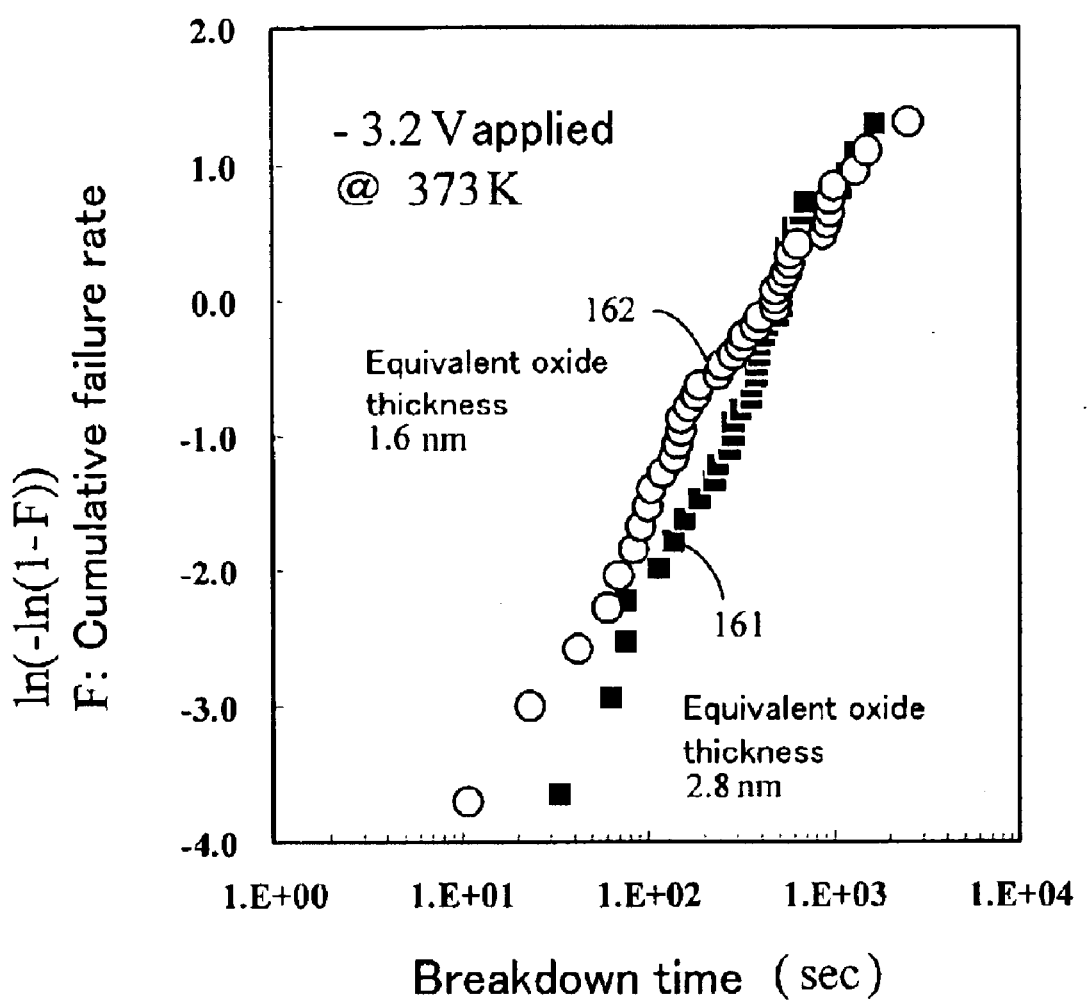
FIG. 17 is a Weibull plot showing the results of the evaluations of reliability of the first and second transistors of the fifth embodiment.
Figure 18A:
FIGS. 18(a) through 18(c) are cross-sectional views illustrating known process steps of forming a gate insulating film composed of an $HfO_2$ film by a plasma CVD method.
Figure 18B:
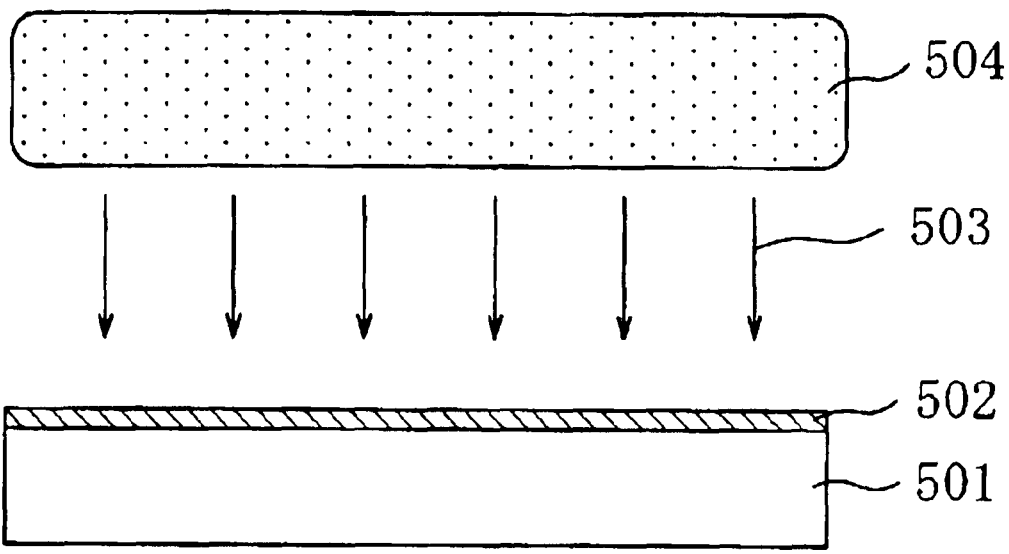
Figure 18C:
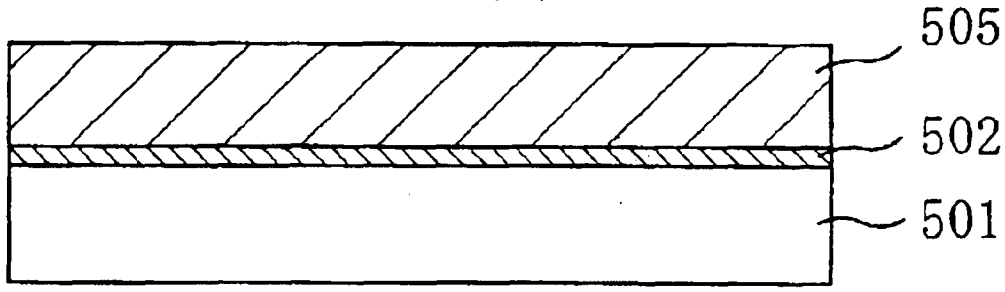

FIG. 17 is a Weibull plot showing the results of the evaluation of reliability of the first transistor 161 and the second transistor 162. In FIG. 17, the abscissa indicates the breakdown time (sec) and the ordinate indicates ln (−ln (1−F)) (F: cumulative failure rate). As shown in FIG. 17, the reliability curve that is to be formed by connecting the data on the first transistor 161 in which the high dielectric film 152 is used as a gate insulating film has a shaper slope than the reliability curve that is to be formed by connecting the data on the second transistor 162 in which the silicon oxynitride film 150 is used as a gate insulating film. This indicates that the reliability of the first transistor 161 was deteriorated more than that of the second transistor 162. However, it is clearly shown that the reliability of the first transistor 161 of the present embodiment was reduced to a lesser extend, compared to that of a transistor in which a silicon oxide film having a thickness of 1.6 nm in terms of equivalent oxide thickness serves as a gate insulating film. As for the second transistor 162 that is disposed in the high reliability section 165, its estimated life time is in the range that allows a ten-year guarantee given.

Accordingly, in the system LSI of the present embodiment, the first transistor 161 that is disposed in the high performance section 164 can suppress increase in the gate leakage current and reduction in reliability while achieving a high-speed operation characteristic.

Specifically, when three types of transistors including oxide films (or oxynitride films) having different thicknesses as gate insulating films are provided, the numbers of process steps in which oxide films that have been already formed are partially removed might be increased, resulting in noticeable inconveniences caused by repeatedly etching the surface of the silicon substrate. In contrast, according to the present embodiment, only two types of silicon oxynitride films, i.e., a silicon oxynitride film for a transistor in the I/O section 166 and a silicon oxynitride film for the first and second transistors in the high performance section 164 and the high reliability section 165 need to be formed, resulting in reducing those inconveniences.

Modified Example of the Embodiment

In the foregoing embodiment, the silicon oxynitride film 150 is formed on the silicon substrate 101 and then Hf is injected into the silicon oxynitride film. However, by using a silicon oxide film instead of the silicon oxynitride film, the above-described effects can be achieved. Alternatively, Zr or Al, instead of Hf, may be injected.

In the foregoing embodiment, the gate insulating film of the first transistor 161 that is disposed in the high performance section 164 is formed of a high dielectric film composed of an Hf—Si—N—O compound and the gate insulating film of the second transistor 162 that is disposed in the high reliability section 165 is composed of the silicon oxynitride film. However, the first and second transistors 161 and 162 may both include a gate insulating film formed of M (metal)—Si—N—O.

In that case, for example, the gate leakage properties and the high-speed operation characteristic can be traded off one against another, for example, by introducing different types of metals into the gate insulating films of the first transistor 161 and the second transistor. Specifically, a metal which forms a silicate having as high a dielectric constant as possible may be introduced into the gate insulating film which is required to operate at a high speed, and a silicate which has a low dielectric constant but has excellent gate leakage properties may be used as the gate insulating film of a transistor in which the amount of the gate leakage current is required to be small.

Alternatively, for example, the gate leakage properties and the high-speed operation characteristic can be traded off one against another, for example, by changing the concentration of a metal to be introduced for each gate insulating film of the first transistor 161 and the second transistor 162.

Furthermore, each of the gate insulating films of the first transistor 161 which is disposed in the high performance section 164, the second transistor 162 which is disposed in the high reliability section 165 and the transistor which is disposed in the I/O section 166 of the foregoing embodiment may be composed of a dielectric film formed of a metal-Si—O compound (silicate). In that case, three different types of metals may be used for silicates for the gate insulating films, or a single type of metal may be introduced into the gate insulating films with different doses. That is to say, in general, different metals are introduced into multiple regions of an initial insulating film, which is formed by introducing at least oxygen into a substrate, or a metal is introduced thereinto at different concentrations, and then heat treatment is carried out to diffuse the metals, thereby forming on the substrate multiple types of transistors including gate insulating films each having different characteristics.

Furthermore, on the basis of the process steps of the second embodiment, the injection dose of Si ions that is to be introduced into a metal film formed on a silicon substrate is changed among the multiple regions located on the silicon substrate, and thereby the gate leakage properties and the high-speed operation characteristic of a resultant transistor can be traded off one against another.

Furthermore, on the basis of the process steps of the third or fourth embodiment, the injection dose of Si ions that is introduced into a metal film formed on a silicon substrate is changed among the multiple regions located on the silicon substrate, and thereby the gate leakage properties and the high-speed operation characteristic of a resultant transistor can be traded off one against another.

According to the methods for forming insulating films or the methods for fabricating semiconductor devices of the present invention, a high dielectric film is formed by utilizing ion implantation or plasma ion implantation, and heat treatment. Therefore, an insulating film which has a good interface state between the insulating film and the semiconductor substrate and which also has good leakage properties can be formed stably in a simple manner.

INDUSTRIAL APPLICABILITY

The present invention can be applied to MIS transistors and MIS capacitors which have a layered structure in which a gate insulating film and a gate electrode are stacked on a semiconductor layer, and LSI devices formed by integration of the MIS transistors and MIS capacitors.

What is claimed is:

1. A method for forming an insulating film, comprising the steps of:
   (a) introducing at least oxygen into a surface region of a semiconductor substrate, thereby forming an initial insulating film;
   (b) introducing at least one type of metal into at least part of the initial insulating film; and
   (c) performing heat treatment at a temperature that does not exceed a recrystallization temperature to diffuse the metal in the initial insulating film, thereby forming at least one high dielectric film having a higher dielectric constant than the initial insulating film on at least part of the semiconductor substrate.

2. The method for forming an insulating film of claim 1, characterized in that in the step a), a silicon substrate is used as the semiconductor substrate and a silicon oxide film or a silicon oxynitride film is formed as the initial insulating film.

3. The method for forming an insulating film of claim 2, characterized in that in the step c), an $SiO_2$ film is left in a region of the initial insulating film around the interface between the initial insulating film and the semiconductor substrate.

4. The method for forming an insulating film of claim 1, characterized in that in the step b), the metal introduced is at least one metal selected from the group consisting of Hf, Zr and Al.

5. The method for forming an insulating film of claim 1, characterized in that in the step b), the metal is introduced into the initial insulating film by an ion implantation method.

6. A method for forming an insulating film, comprising the steps of:
   a) introducing at least oxygen into a surface region of a semiconductor substrate, thereby forming an initial insulating film;
   b) introducing at least one type of metal into at least part of the initial insulating film; and
   c) performing heat treatment to diffuse the metal in the initial insulating film, thereby forming at least one high dielectric film having a higher dielectric constant than the initial insulating film on at least part of the semiconductor substrate,
   characterized in that in the step b), metal ions in a plasma are introduced into the initial insulating film.

7. A method for forming an insulating film, comprising the steps of:
   a) introducing at least oxygen into a surface region of a semiconductor substrate, thereby forming an initial insulating film;
   b) introducing at least one type of metal into at least part of the initial insulating film; and
   c) performing heat treatment to diffuse the metal in the initial insulating film, thereby forming at least one high dielectric film having a higher dielectric constant than the initial insulating film on at least part of the semiconductor substrate,
   characterized in that in the step b), the metal is introduced into only a first transistor formation region in the initial insulating film and in the step c), the high dielectric film is formed in only the first transistor formation region in the initial insulating film,
   wherein the high dielectric film is used as a gate insulating film of a first transistor and the initial insulating film is used as a gate insulating film of a second transistor which operates at a slower speed than the first transistor.

8. A method for forming an insulating film, comprising the steps of:
   a) introducing at least oxygen into a surface region of a semiconductor substrate, thereby forming an initial insulating film;
   b) introducing at least one type of metal into at least part of the initial insulating film; and
   c) performing heat treatment to diffuse the metal in the initial insulating film, thereby forming at least one high dielectric film having a higher dielectric constant than the initial insulating film on at least part of the semiconductor substrate, characterized in that in the step b), different types of multiple metals, as said at least one type of the metal, are introduced into multiple regions in the initial insulating film and in the step c), the metals are diffused in the initial insulating film to form as said at least one high dielectric film multiple high dielectric films having a higher dielectric constant than the initial insulating film.

9. A method for forming an insulating film, comprising the steps of:
   a) introducing at least oxygen into a surface region of a semiconductor substrate, thereby forming an initial insulating film;
   b) introducing at least one type of metal into at least part of the initial insulating film; and
   c) performing heat treatment to diffuse the metal in the initial insulating film, thereby forming at least one high dielectric film having a higher dielectric constant than the initial insulating film on at least part of the semiconductor substrate,
   characterized in that in the step b), one type of metal is introduced into multiple regions in the initial insulating film at different concentrations and in the step c), the metal is diffused in the initial insulating film to form as said at least one high dielectric film multiple high dielectric films having a higher dielectric constant than the initial insulating film.

10. A method for forming an insulating film, comprising the steps of:
   (a) forming an initial insulating film including at least a metal oxide film on a semiconductor substrate;
   (b) introducing atoms of the semiconductor forming the semiconductor substrate into at least part of the initial insulating film; and
   (c) performing heat treatment at a temperature that does not exceed a recrystallization temperature to diffuse the atoms of the semiconductor in the initial insulating film, thereby forming at least one dielectric film having a different dielectric constant from the initial insulating film in at least part of the initial insulating film.

11. The method for forming an insulating film of claim 10, characterized in that in the step c), the heat treatment is performed in an oxidizing atmosphere.

12. The method for forming an insulating film of claim 10, characterized in that in the step a), a silicon substrate is used as the semiconductor substrate and a layered film selected from the group consisting of layered films of an $SiO_2$ film and a $ZrO_2$ film, an $SiO_2$ film and an $HfO_2$ film, and a $ZrO_2$ film and an $HfO_2$ film is formed as the initial insulating film.

13. The method for forming an insulating film of claim 10, characterized in that in the step b), the atoms of the semiconductor are introduced into multiple regions in the initial insulating film at different concentrations and in the step c), multiple dielectric films having different dielectric constants are formed as said at least one dielectric film,
   wherein the dielectric films are used as gate insulating films of multiple transistors having different operation characteristics.

14. A method for forming an insulating film, comprising the steps of:
   (a) forming an initial insulating film on a semiconductor substrate;
   (b) depositing a metal film on at least part of the initial insulating film; and
   (c) performing heat treatment at a temperature that does not exceed a recrystallization temperature to diffuse metal atoms of the metal film in the initial insulating film, thereby forming at least one high dielectric film having a higher dielectric constant than the initial insulating film.

15. The method for forming an insulating film of claim 14, characterized in that in the step a), a silicon substrate is used as the semiconductor substrate and a silicon oxide film or a silicon oxynitride film is formed as the initial insulating film.

16. A method for forming an insulating film, comprising the steps of:
   a) forming an initial insulating film on a semiconductor substrate;
   b) depositing a metal film on at least part of the initial insulating film; and
   c) performing heat treatment to diffuse metal atoms of the metal film in the initial insulating film, thereby forming at least one high dielectric film having a higher dielectric constant than the initial insulating film
   characterized in that in the step b), different types of multiple metal films are deposited on multiple regions in the initial insulating films and in the step c), multiple high dielectric films having different dielectric constants are formed as said at least one high dielectric film,
   wherein the high dielectric films are used as gate insulating films of multiple transistors having different operation characteristics.

17. A method for fabricating a semiconductor device, comprising the steps of:
   (a) introducing at least oxygen into a surface region of a semiconductor substrate, thereby forming an initial insulating film;
   (b) introducing at least one type of metal into at least part of the initial insulating film;
   (c) forming a conductor film on the initial insulating film;
   (d) patterning the conductor film, thereby forming a gate electrode of at least one transistor;
   (e) introducing an impurity into regions of the semiconductor substrate located on both sides of the gate electrode, thereby forming source/drain regions of at least one transistor; and
   (f) performing heat treatment at a temperature that does not exceed a recrystallization temperature to activate the impurity which has been introduced into the source/drain regions, and to diffuse the metal in the initial insulating film, thereby forming in at least part of the initial insulating film a high dielectric film which has a higher dielectric constant than the initial insulating film and which serves as a gate insulating film of at least one transistor.

18. A method for fabricating a semiconductor device, comprising the steps of:
   a) introducing at least oxygen into a surface region of a semiconductor substrate, thereby forming an initial insulating film;
   b) introducing at least one type of metal into at least part of the initial insulating film;
   c) forming a conductor film on the initial insulating film;
   d) patterning the conductor film, thereby forming a gate electrode of at least one transistor;
   e) introducing an impurity into regions of the semiconductor substrate located on both sides of the gate electrode, thereby forming source/drain regions of at least one transistor; and f) performing heat treatment to activate the impurity which has been introduced into the source/drain regions, and to diffuse the metal in the initial insulating film, thereby forming in at least part of the initial insulating film a high dielectric film which has a higher dielectric constant than the initial insulating film and which serves as a gate insulating film of at least one transistor, characterized in that in the step b), the metal is introduced into only a first transistor formation region in the initial insulating film and in the step f), the high dielectric film is formed in only the first transistor formation region in the initial insulating film, wherein, as said at least one transistor, a first transistor in which the high dielectric film serves as a gate insulating film, and a second transistor in which the initial insulating film serves as a gate insulating film and which operates at a slower speed than the first transistor are formed.

19. The method for fabricating a semiconductor device of claim 18, characterized in that in the step b), different types of multiple metals, as said at least one type of metal, are introduced into multiple regions in the initial insulating film and in the step f), the metals are diffused in the initial insulating film to form as said at least one high dielectric film multiple high dielectric films having a higher dielectric constant than the initial insulating film, wherein multiple transistors including the high dielectric films which serve as gate insulating films and having different operation characteristics are formed.

20. A method for fabricating a semiconductor device, comprising the steps of:

(a) forming an initial insulating film including at least a metal oxide film on a semiconductor substrate;

(b) introducing atoms of the semiconductor forming the semiconductor substrate into at least part of the initial insulating film;

(c) forming a conductor film on the initial insulating film;

(d) patterning the conductor film, thereby forming a gate electrode of at least one transistor;

(e) introducing an impurity into regions of the semiconductor substrate located on both sides of the gate electrode, thereby forming source/drain regions of at least one transistor; and (f) performing heat treatment at a temperature that does not exceed a recrystallization temperature to activate the impurity which has been introduced into the source/drain regions, and to diffuse the atoms of the semiconductor in the initial insulating film, thereby forming in at least part of the initial insulating film a dielectric film which has a different dielectric constant from the initial insulating film and which serves as a gate insulating film of at least one transistor.

21. A method for fabricating a semiconductor device, comprising the steps of:

a) forming an initial insulating film including at least a metal oxide film on a semiconductor substrate;

b) introducing atoms of the semiconductor forming the semiconductor substrate into at least part of the initial insulating film;

c) forming a conductor film on the initial insulating film;

d) patterning the conductor film, thereby forming a gate electrode of at least one transistor;

e) introducing an impurity into regions of the semiconductor substrate located on both sides of the gate electrode, thereby forming source/drain regions of at least one transistor; and f) performing heat treatment to activate the impurity which has been introduced into the source/drain regions, and to diffuse the atoms of the semiconductor in the initial insulating film, thereby forming in at least part of the initial insulating film a dielectric film which has a different dielectric constant from the initial insulating film and which serves as a gate insulating film of at least one transistor, characterized in that in the step b), the atoms of the semiconductor are introduced into multiple regions in the initial insulating film at different concentrations and in the step c), multiple dielectric films having different dielectric constants are formed as said at least one dielectric film, wherein multiple transistors including the dielectric films which serve as gate insulating films and having different operation characteristics are formed as said at least one transistor.

22. A method for fabricating a semiconductor device, comprising the steps of:

(a) forming an initial insulating film on a semiconductor substrate;

(b) depositing a metal film on at least part of the initial insulating film;

(c) forming a conductor film on the metal film;

(d) patterning the conductor film, thereby forming a gate electrode;

(e) introducing an impurity into regions of the semiconductor substrate located on both sides of the gate electrode, thereby forming source/drain regions; and (f) performing heat treatment at a temperature that does not exceed a recrystallization temperature to activate the impurity which has been introduced into the source/drain regions, and to diffuse metal atoms of the metal film in the initial insulating film, thereby forming in at least part of the initial insulating film a high dielectric film which has a higher dielectric constant than the initial insulating film and which serves as a gate insulating film of at least one transistor.

23. A method for fabricating a semiconductor device, comprising the steps of:

a) forming an initial insulating film on a semiconductor substrate;

b) depositing a metal film on at least part of the initial insulating film;

c) forming a conductor film on the metal film;

d) patterning the conductor film, thereby forming a gate electrode;

e) introducing an impurity into regions of the semiconductor substrate located on both sides of the gate electrode, thereby forming source/drain regions; and f) performing heat treatment to activate the impurity which has been introduced into the source/drain regions, and to diffuse metal atoms of the metal film in the initial insulating film, thereby forming in at least part of the initial insulating film a high dielectric film which has a higher dielectric constant than the initial insulating film and which serves as a gate insulating film of at least one transistor, characterized in that in the step b), different types of multiple metal films are deposited on multiple regions in the initial insulating films and in the step f), multiple high dielectric films having different dielectric constants are formed as said at least one dielectric film, wherein multiple transistors including the high dielectric films as gate insulating films and having different operation characteristics are formed.

24. A method for forming an insulating film, comprising the steps of:
(a) forming an initial insulating film including at least a metal oxide film on a semiconductor substrate;
(b) introducing atoms of the semiconductor forming the semiconductor substrate into at least part of the initial insulating film; and
(c) performing heat treatment to diffuse the atoms of the semiconductor in the initial insulating film, thereby forming at least one dielectric film having a different dielectric constant from the initial insulating film in at least part of the initial insulating film in an oxidizing atmosphere so that the rate of contained semiconductor atoms and O atoms increases in part of the dielectric film which is closer to the semiconductor substrate.

25. A method for forming an insulating film, comprising the steps of:
(a) forming an initial insulating film on a semiconductor substrate;
(b) depositing a metal film on at least part of the initial insulating film; and
(c) performing heat treatment to diffuse metal atoms of the metal film in the initial insulating film, thereby forming at least one high dielectric film, between the initial insulating film and the metal film, having a higher dielectric constant than the initial insulating film.

26. A method for fabricating a semiconductor device, comprising the steps of:
(a) introducing at least oxygen into a surface region of a semiconductor substrate, thereby forming an initial insulating film;
(b) introducing at least one type of metal into at least part of the initial insulating film by introducing metal ions into at least part of the initial insulating film from a plasma;
c) forming a conductor film on the initial insulating film;
d) patterning the conductor film, thereby forming a gate electrode of at least one transistor;
(d) introducing an impurity into regions of the semiconductor substrate located on both sides of the gate electrode, thereby forming source/drain regions of at least one transistor; and
(e) performing heat treatment to activate the impurity which has been introduced into the source/drain regions, and to diffuse the metal in the initial insulating film, thereby forming in at least part of the initial insulating film a high dielectric film which has a higher dielectric constant than the initial insulating film and which serves as a gate insulating film of at least one transistor.

27. A method for fabricating a semiconductor device, comprising the steps of:
(a) forming an initial insulating film including at least a metal oxide film on a semiconductor substrate;
(b) introducing atoms of the semiconductor forming the semiconductor substrate into at least part of the initial insulating film;
(c) forming a conductor film on the initial insulating film;
(d) patterning the conductor film, thereby forming a gate electrode of at least one transistor;
(e) introducing an impurity into regions of the semiconductor substrate located on both sides of the gate electrode, thereby forming source/drain regions of at least one transistor; and
(f) performing heat treatment to activate the impurity which has been introduced into the source/drain regions, and to diffuse the atoms of the semiconductor in the initial insulating film, thereby forming in at least part of the initial insulating film a dielectric film which has a different dielectric constant from the initial insulating film and which serves as a gate insulating film of at least one transistor in an oxidizing atmosphere so that the rate of contained semiconductor atoms and O atoms increases in part of the dielectric film which is closer to the semiconductor substrate.

28. A method for fabricating a semiconductor device, comprising the steps of:
(a) forming an initial insulating film on a semiconductor substrate;
(b) depositing a metal film on at least part of the initial insulating film;
(c) forming a conductor film on the metal film;
(d) patterning the conductor film, thereby forming a gate electrode;
(e) introducing an impurity into regions of the semiconductor substrate located on both sides of the gate electrode, thereby forming source/drain regions; and
(f) performing heat treatment to activate the impurity which has been introduced into the source/drain regions, and to diffuse metal atoms of the metal film in the initial insulating film, thereby forming in at least part of the initial insulating film a high dielectric film, between the initial insulating film and the metal film, which has a higher dielectric constant than the initial insulating film and which serves as a gate insulating film of at least one transistor.

* * * * *